United States Patent
Richardson et al.

(10) Patent No.: US 11,043,966 B2
(45) Date of Patent: Jun. 22, 2021

(54) METHODS AND APPARATUS FOR EFFICIENTLY GENERATING MULTIPLE LIFTED LOW-DENSITY PARITY-CHECK (LDPC) CODES

(71) Applicant: QUALCOMM Incorporated, San Diego, CA (US)

(72) Inventors: Thomas Joseph Richardson, South Orange, NJ (US); Shrinivas Kudekar, Raritan, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/591,625

(22) Filed: May 10, 2017

(65) Prior Publication Data
US 2017/0331494 A1 Nov. 16, 2017

Related U.S. Application Data

(60) Provisional application No. 62/334,977, filed on May 11, 2016.

(51) Int. Cl.
H03M 13/00 (2006.01)
H03M 13/11 (2006.01)
(Continued)

(52) U.S. Cl.
CPC ..... H03M 13/1102 (2013.01); H03M 13/036 (2013.01); H03M 13/116 (2013.01);
(Continued)

(58) Field of Classification Search
None
See application file for complete search history.

(56) References Cited

U.S. PATENT DOCUMENTS 5,583,500 A * 12/1996 Allen ................. H03M 7/4006
341/107
5,844,918 A  12/1998 Kato
(Continued)

FOREIGN PATENT DOCUMENTS

CN 1399829 A 2/2003
CN 101188428 A 5/2008
(Continued)

OTHER PUBLICATIONS

IEEE: "IEEEStd 802.16e-2005, Air Interface for Fixed and Mobile Broadband Wireless Access Systems," Amendment 2 and Corrigendum 1 to IEEE Std 802.16-2004, IEEE Std 802.16E-2005, Feb. 28, 2006 (Feb. 28, 2006), pp. 626-630, XP002515198.
(Continued)

Primary Examiner — Mujtaba M Chaudry
(74) Attorney, Agent, or Firm — Linda G. Gunderson; Patterson & Sheridan LLP

(57) ABSTRACT

Techniques and apparatus are provided for efficiently generating multiple lifted low-density parity-check (LDPC) codes for a range of block lengths and having good performance. A method for wireless communications by a transmitting device generally includes selecting integer lifting values for a first lifting size value Z, selected from a range of lifting size values, wherein the selected integer lifting value is greater than a maximum lifting size value of the range of lifting size values; determining one or more integer lifting values for generating at least a second lifted LDPC code having a second lifting size value based on an operation involving the second lifting size value and the selected one or more integer lifting values for generating the first lifted LDPC code; encoding a set of information bits based on the second lifted LDPC to produce a code word; and transmitting the code word.

20 Claims, 13 Drawing Sheets

(51) Int. Cl.
*H03M 13/03* (2006.01)
*H04L 1/00* (2006.01)
(52) U.S. Cl.
CPC ........ *H03M 13/616* (2013.01); *H04L 1/0041* (2013.01); *H04L 1/0058* (2013.01); *H03M 13/1137* (2013.01); *H03M 13/1168* (2013.01); *H03M 13/6362* (2013.01)

(56) References Cited

U.S. PATENT DOCUMENTS

| | | | |
|---|---|---|---|
| 6,633,865 | B1 | 10/2003 | Liao |
| 6,854,082 | B1* | 2/2005 | Rhee .................... H03M 13/35 714/755 |
| 6,931,581 | B1 | 8/2005 | Cassiday et al. |
| 6,961,388 | B2 | 11/2005 | Ling et al. |
| 6,961,888 | B2 | 11/2005 | Jin et al. |
| 7,133,853 | B2 | 11/2006 | Richardson et al. |
| 7,222,284 | B2 | 5/2007 | Stolpman |
| 7,493,551 | B2 | 2/2009 | Berens et al. |
| 7,526,717 | B2 | 4/2009 | Kyung et al. |
| 7,552,097 | B2 | 6/2009 | Richardson et al. |
| 7,571,372 | B1 | 8/2009 | Burd et al. |
| 7,581,159 | B2 | 8/2009 | Hocevar |
| 7,627,801 | B2 | 12/2009 | Jin et al. |
| 7,793,194 | B2 | 9/2010 | Seo et al. |
| 7,840,880 | B1 | 11/2010 | Bain |
| 7,979,784 | B2 | 7/2011 | Shao et al. |
| 7,986,622 | B2 | 7/2011 | Frazier et al. |
| 8,006,162 | B2 | 8/2011 | Choi et al. |
| 8,117,516 | B2 | 2/2012 | Kim et al. |
| 8,132,072 | B2 | 3/2012 | El-Khamy et al. |
| 8,151,157 | B2 | 4/2012 | Lee et al. |
| 8,271,846 | B2 | 9/2012 | Myung et al. |
| 8,418,015 | B2 | 4/2013 | Cao et al. |
| 8,484,545 | B2 | 7/2013 | McLaughlin et al. |
| 8,516,334 | B2 | 8/2013 | Xu et al. |
| 8,687,751 | B1 | 4/2014 | Lee et al. |
| 8,751,902 | B2 | 6/2014 | Jin et al. |
| 8,892,979 | B2 | 11/2014 | Richardson et al. |
| 9,362,956 | B2 | 6/2016 | Mahdavifar et al. |
| 9,479,375 | B1 | 10/2016 | Ankarali et al. |
| 9,667,381 | B2 | 5/2017 | Jeong et al. |
| 9,692,451 | B2 | 6/2017 | Vasista et al. |
| 9,917,675 | B2 | 3/2018 | Kudekar et al. |
| 1,029,135 | A1 | 5/2019 | Richardson et al. |
| 1,031,293 | A1 | 6/2019 | Richardson et al. |
| 1,031,305 | A1 | 6/2019 | Lin et al. |
| 2002/0147954 | A1 | 10/2002 | Shea |
| 2003/0033575 | A1 | 2/2003 | Richardson et al. |
| 2003/0053435 | A1 | 3/2003 | Sindhushayana et al. |
| 2003/0123409 | A1 | 7/2003 | Kwak et al. |
| 2004/0187129 | A1 | 9/2004 | Richardson |
| 2005/0078765 | A1 | 4/2005 | Jeong et al. |
| 2005/0149842 | A1 | 7/2005 | Kyung et al. |
| 2005/0283707 | A1 | 12/2005 | Sharon et al. |
| 2005/0283708 | A1 | 12/2005 | Kyung et al. |
| 2006/0020868 | A1* | 1/2006 | Richardson ........ H03M 13/1137 714/752 |
| 2006/0020872 | A1 | 1/2006 | Richardson et al. |
| 2006/0156199 | A1 | 7/2006 | Palanki et al. |
| 2006/0184855 | A1 | 8/2006 | Wang et al. |
| 2006/0294445 | A1 | 12/2006 | Divsalar et al. |
| 2007/0101243 | A1 | 5/2007 | Kim et al. |
| 2007/0113147 | A1 | 5/2007 | Hong et al. |
| 2007/0113148 | A1 | 5/2007 | Hong et al. |
| 2007/0136636 | A1 | 6/2007 | Tsai et al. |
| 2008/0059862 | A1 | 3/2008 | Kyung et al. |
| 2008/0126916 | A1 | 5/2008 | Chung et al. |
| 2008/0178065 | A1* | 7/2008 | Khandekar ....... H03M 13/6516 714/801 |
| 2008/0207120 | A1 | 8/2008 | Kurina et al. |
| 2008/0320353 | A1 | 12/2008 | Blankenship et al. |
| 2009/0158129 | A1 | 6/2009 | Myung et al. |
| 2009/0204868 | A1 | 8/2009 | Park et al. |
| 2009/0217129 | A1 | 8/2009 | Myung et al. |
| 2009/0259915 | A1 | 10/2009 | Livshitz et al. |
| 2009/0300461 | A1* | 12/2009 | Shor .................. H03M 13/1114 714/752 |
| 2010/0023834 | A1 | 1/2010 | Richardson et al. |
| 2010/0077275 | A1 | 3/2010 | Yu et al. |
| 2010/0107033 | A1 | 4/2010 | Kuri et al. |
| 2010/0185926 | A1 | 7/2010 | Lawson et al. |
| 2010/0199153 | A1 | 8/2010 | Okamura et al. |
| 2010/0211844 | A1 | 8/2010 | Yuda et al. |
| 2010/0257425 | A1* | 10/2010 | Yue ..................... H03M 13/033 714/752 |
| 2010/0275089 | A1 | 10/2010 | Mow et al. |
| 2010/0325511 | A1 | 12/2010 | Oh et al. |
| 2011/0047433 | A1 | 2/2011 | Abu-Surra et al. |
| 2011/0066916 | A1 | 3/2011 | Abu-Surra et al. |
| 2011/0096862 | A1 | 4/2011 | Kuri et al. |
| 2011/0126072 | A1 | 5/2011 | Yoshimoto et al. |
| 2011/0161772 | A1 | 6/2011 | Yoshii et al. |
| 2012/0084625 | A1* | 4/2012 | Pisek .................. H03M 13/033 714/757 |
| 2012/0166917 | A1 | 6/2012 | El-Khamy et al. |
| 2012/0240001 | A1* | 9/2012 | Abu-Surra .......... H03M 13/033 714/752 |
| 2012/0317461 | A1 | 12/2012 | Hwang et al. |
| 2013/0051556 | A1 | 2/2013 | Myung et al. |
| 2013/0117344 | A1 | 5/2013 | Gross et al. |
| 2013/0272378 | A1 | 10/2013 | Sole Rojals et al. |
| 2014/0003533 | A1 | 1/2014 | He et al. |
| 2014/0019820 | A1 | 1/2014 | Vardy et al. |
| 2014/0040214 | A1 | 2/2014 | Ma et al. |
| 2014/0173376 | A1 | 6/2014 | Jeong et al. |
| 2014/0201592 | A1 | 7/2014 | Shen et al. |
| 2014/0229788 | A1 | 8/2014 | Richardson |
| 2014/0229789 | A1 | 8/2014 | Richardson |
| 2014/0304574 | A1 | 10/2014 | Seo et al. |
| 2014/0365842 | A1 | 12/2014 | Li et al. |
| 2014/0365845 | A1 | 12/2014 | Pantelias et al. |
| 2015/0120798 | A1 | 4/2015 | Jeong et al. |
| 2015/0188666 | A1 | 7/2015 | Mahdavifar et al. |
| 2015/0229337 | A1 | 8/2015 | Alhussien et al. |
| 2015/0293716 | A1 | 10/2015 | Jiang et al. |
| 2015/0381208 | A1 | 12/2015 | Li et al. |
| 2016/0013810 | A1 | 1/2016 | Gross et al. |
| 2016/0013931 | A1 | 1/2016 | Pisek et al. |
| 2016/0087648 | A1 | 3/2016 | Korb et al. |
| 2016/0164537 | A1* | 6/2016 | Pisek .................. H03M 13/116 714/755 |
| 2016/0164629 | A1 | 6/2016 | Ahn et al. |
| 2016/0173132 | A1* | 6/2016 | Cho .................. H03M 13/1154 714/752 |
| 2016/0218750 | A1 | 7/2016 | Ma |
| 2016/0380763 | A1 | 12/2016 | Ahn et al. |
| 2017/0047947 | A1 | 2/2017 | Hong et al. |
| 2017/0141798 | A1 | 5/2017 | Kudekar et al. |
| 2017/0187489 | A1 | 6/2017 | Myung et al. |
| 2017/0222663 | A1 | 8/2017 | Parthasarathy et al. |
| 2017/0230149 | A1 | 8/2017 | Wang et al. |
| 2017/0331497 | A1 | 11/2017 | Richardson et al. |
| 2017/0353267 | A1 | 12/2017 | Kudekar et al. |
| 2017/0359086 | A1 | 12/2017 | Kudekar et al. |
| 2018/0152205 | A1 | 5/2018 | Kim et al. |
| 2018/0205498 | A1 | 7/2018 | Kudekar et al. |
| 2018/0226992 | A1 | 8/2018 | Panteleev et al. |
| 2018/0367245 | A1 | 12/2018 | Soriaga et al. |
| 2018/0367253 | A1 | 12/2018 | Nammi et al. |
| 2019/0013900 | A1 | 1/2019 | Patel et al. |
| 2019/0052400 | A1 | 2/2019 | Soriaga et al. |
| 2019/0199475 | A1 | 6/2019 | Richardson et al. |
| 2019/0245654 | A1 | 8/2019 | Richardson et al. |
| 2019/0260507 | A1 | 8/2019 | Lin et al. |
| 2019/0280817 | A1 | 9/2019 | Kudekar et al. |
| 2019/0356337 | A1 | 11/2019 | Richardson et al. |
| 2020/0052817 | A1 | 2/2020 | Kudekar et al. |
| 2020/0059317 | A1 | 2/2020 | Patel et al. |
| 2020/0067641 | A1 | 2/2020 | Ma et al. |
| 2020/0162109 | A1 | 5/2020 | Zhang et al. |

(56) References Cited

U.S. PATENT DOCUMENTS

2020/0322085 A1 10/2020 Kudekar et al.
2020/0412387 A1 12/2020 Kudekar

FOREIGN PATENT DOCUMENTS

| | | |
|---|---|---|
| CN | 101682381 A | 3/2010 |
| CN | 102017426 A | 4/2011 |
| CN | 102437858 A | 5/2012 |
| CN | 102651652 A | 8/2012 |
| CN | 102783206 A | 11/2012 |
| CN | 103188044 A | 7/2013 |
| CN | 103281166 A | 9/2013 |
| CN | 103746708 A | 4/2014 |
| CN | 103780329 A | 5/2014 |
| CN | 105227189 A | 1/2016 |
| CN | 105284053 A | 1/2016 |
| CN | 105306165 A | 2/2016 |
| CN | 105337696 A | 2/2016 |
| CN | 106341138 A | 1/2017 |
| EP | 1601109 A2 | 11/2005 |
| EP | 2091171 A2 | 8/2009 |
| EP | 2096760 A1 | 9/2009 |
| EP | 2899912 A1 | 7/2015 |
| EP | 3046259 A1 | 7/2016 |
| EP | 3264611 A1 | 1/2018 |
| JP | 2007507156 A | 3/2007 |
| JP | 2011514049 A | 4/2011 |
| JP | 2016539534 A | 12/2016 |
| KR | 101157246 B1 | 6/2012 |
| KR | 20170053589 A | 5/2017 |
| RU | 2520406 C2 | 6/2014 |
| TW | 200711359 A | 3/2007 |
| WO | 2002062002 A1 | 8/2002 |
| WO | WO-2009011134 A1 | 1/2009 |
| WO | WO-2015139297 A1 | 9/2015 |
| WO | 2017092693 A1 | 6/2017 |
| WO | WO-2017091244 A1 | 6/2017 |
| WO | WO-2017209837 A1 | 12/2017 |
| WO | WO-2018029633 A1 | 2/2018 |
| WO | WO-2018030927 A1 | 2/2018 |
| WO | 2018050062 A1 | 3/2018 |
| WO | WO-2018128560 A1 | 7/2018 |
| WO | WO-2018144560 A1 | 8/2018 |

OTHER PUBLICATIONS

International Search Report and Written Opinion—PCT/US2017/032156—ISA/EPO—dated Aug. 14, 2017.
Myung S., et al., "Extension of Quasi-cyclic LDPC Codes by Lifting," PROC ., IEEE International Symposium on Information Theory, ISIT 2005, Adelaide, Australia, Sep. 4, 2005 (Sep. 4, 2005)-Sep. 9, 2005 (Sep. 9, 2005), pp. 2305-2309, XP010845965, ISBN: 978-0-7803-9151-2.
Myung S., et al., "Lifting Methods for Quasi-Cyclic LDPC Codes", IEEE Communications Letters, Jun. 2006, vol. 10, No. 6, pp. 489-491.
Mackay D.J.C., "Good Error-Correcting Codes Based on Very Sparse Matrices," IEEE Transactions on Information Theory, Mar. 1999, vol. 45 (2), pp. 399-431.
Roth C., et al., "A 15.8 pJ/bit/iter Quasi-Cyclic LDPC Decoder for IEEE 802.11n in 90 nm CMOS," IEEE Asian Solid-State Circuits Conference, Nov. 8-10, 2010, 4 pages.
Zhang Z., et al., "An Efficient 10GBASE-T Ethernet LDPC Decoder Design With Low Error Floors," IEEE Journal of Solid-State Circuits, Apr. 2010, vol. 45 (4), pp. 843-855.
Abbasfar A., et al., "Accumulate Repeat Accumulate Codes", Dec. 2, 2003, XP002585965, Retrieved from the Internet: URL: http://trs-new.jpl.nasa.govidspace/bitstream/2014/8047/1/03-3469.pdf [retrieved on Jun. 4, 2010], 6 pages.
Alcatel-Lucent et al., "LDPC Coding Proposal for LBC", 3GPP2 Draft; C30-20070226-002_C30-20070212-034R1_AHLQRZ_LDPC_PROPOSAL_FOR_LBC, Mar. 27, 2007, XP062206073, Retrieved from the Internet: URL:http://ftp.3gpp2.org/TSGC/Working/2007/2007-03-Atlanta/TSG-C-2007-03-Atlanta/WG3/LDPC Ad Hoc Call,2007.02.26/ pp. 1-27.
Alcatel-Lucent et al., "LDPC Coding Proposal for LBC", 3GPP2-Drafts, 2500 Wilson Boulevard, Suite 300, Arlington, Virginia 22201, USA, Mar. 15, 2007, XP040477608, 32 pages.
Arikan E., "A Survey of Reed-Muller Codes From Polar Coding Perspective", Information Theory Workshop (ITW), Piscataway, NJ, USA, Jan. 6, 2010, pp. 1-5, XP031703947, ISBN: 978-1-4244-6372-5.
Arikan E., "Channel Polarization: a Method for Constructing Capacity-Achieving Codes for Symmetric Binary-Input Memoryless Channels," IEEE Transactions on Information Theory, vol. 55 (7), 2009, pp. 3051-3073, XP080428257.
Chen B., et al., "List Viterbi Algorithms for Continuous Transmission", IEEE Transactions on Communications, vol. 49 No. 5, XP011009921, May 1, 2001, pp. 784-792.
Chen T.Y., et al., "Protograph-based Raptor-Like LDPC Codes with Low Thresholds", IEEE International Conference on Communications, Jun. 10, 2012, DOI: 10.1109/ICC.2012.6363996, ISBN: 978-1-4577-2052-9, pp. 2161-2165.
Chiu M.C., et al., "Reduced-Complexity SCL Decoding of Multi-CRC-Aided Polar Codes", Sep. 28, 2016, XP055384603, pp. 1-9, Retrieved from the Internet: URL:https://arxiv.org/pdf/1609.08813.pdf [retrieved on Jun. 23, 2017].
Deng X., et al., "Segmented Cyclic Redundancy Check: A Data Protection Scheme for Fast Reading RFID Tag's Memory," IEEE Wireless Communications and Networking Conference, 2008, pp. 1576-1581.
El-Khamy M., et al., "Binary Polar Codes are Optimized Codes for Bitwise Multistage Decoding", Computer Science, Information Theory,Arxiv.org, Cornell University Library, 201 Olin Library Cornell University Ithaca, NY 14853, Apr. 12, 2016, XP080695103, DOI: 10.1049/El.2016.0837, 2 pages
El-Khamy M., et al., "Design of Rate Compatible Structured LDPC Codes for Hybrid ARQ Applications", IEEE, Aug. 1, 2009, vol. 27(6), pp. 965-973.
Ericsson: "Design Parameters and Implementation Aspects of LPDC Codes," 3GPP Draft; R1-1703537 Design Parameters and Implementation Aspects of LDPC Codes, 3rd Generation Partnership Project (3GPP), Mobile Competence Centre; 650, Route Des Lucioles; F-06921 Sophia-Antipolis, vol. RAN WG1, No. Athens, Greece; 20170213-20170217, Feb. 15, 2017, XP051222070, 10 pages, Retrieved from the Internet: URL: http://www.3gpp.org/ftp/tsg_ran/WG1_RL1/TSGR1_88/Docs/ [retrieved on Feb. 15, 2017].
Ericsson: "Performance and Complexity of Per-Segment CRC Attachment Methods" 3GPP Draft; R1-073741, 3rd Generation Partnership Project (3GPP), Mobile Competence Centre, 650, Route Des Lucioles, F-06921, Sophia-Antipolis Cedex, France, vol. Ran WG1, No. Athens, Greece; Aug. 15, 2007, XP050107330, 3 pages.
Hashemi S.A., et al., "Partitioned Successive-Cancellation List Decoding of Polar Codes", 2016 IEEE International Conference on Acoustics. Speech and Signal Processing (ICASSP), Mar. 20, 2016, pp. 957-960, XP032900743, DOI: 10.1109/ICASSP.2016.7471817, [retrieved on May 18, 2016].
"IEEE Standard for Local and Metropolitan Area Networks Part 16: Air Interface for Broadband Wireless Access Systems; IEEE Std 802.16/2009 (Revision of IEEE Std 802.16/2004)", May 29, 2009, XP068045637, ISBN: 978-0/7381-5919-5, pp. 1-2080.
Interdigital Inc: "Code Block Segmentation for Data Channel", 3GPP Draft; R1-1710958, Code Block Segmentation for Data Channel, 3rd Generation Partnership Project (3GPP), Mobile Competence Centre; 650 Route Des Lucioles; F-06921, Sophia-Antipolis Cedex; France, vol. RAN WG1, No. Qingdao; 20170627-20170630, Jun. 26, 2017 (Jun. 26, 2017), XP051300159, Retrieved from the Internet: URL: http://www.3gpp.org/ftp/Meetings_3GPP_SYNC/RAN1/Docs/ [retrieved on Jun. 26, 2017].
Jiang M., et al., "An Improved Variable Length Coding Scheme Using Structured LDPC Codes", IEEE, Oct. 1, 2010, 5 Pages.
Jun Lin et al., "A reduced latency list decoding algorithm for polar codes", 2014 IEEE Workshop on Signal Processing Systems (SIPS), Oct. 1, 2014, p. 1-6.

(56) References Cited

OTHER PUBLICATIONS

Liu J., et al., "Rate-Compatible LDPC Codes with Short Block Lengths Based on Puncturing and Extension Techniques," 2014, pp. 1-20.
Lucas R et al., "Improved Soft-Decision Decoding of Reed-Muller Codes as Generalized Multiple Concatenated Codes", ITG-Fachberi, vol. 183, VDE-VERLAG, DE, No. 146, Mar. 5, 1998, pp. 137-142.
Mahdavifar H., et al., "On the Construction and Decoding of Concatenated Polar Codes", IEEE International Symposium on Information Theory, Jul. 7, 2013, pp. 952-956, XP032497043, ISSN: 2157-8095, DOI: 10.1109/ISIT.2013.6620367 [retrieved on Oct. 3, 2013].
Mediatek Inc: "Multi-Codebook Embedded Compact QC-LDPC Designs", 3GPP TSG-RAN WG1 NR, R1-1706175, Apr. 4, 2017, XP051252463, Retrieved from the Internet: URL:http://www.3gpp.org/ftp/tsg_ran/WG1_RL1/TSGR1_88b/Docs/, 14 pages.
Nguyen T.V., et al., "The Design of Rate-Compatible Protograph LDPC Codes", IEEE Transactions on Communications, Oct. 1, 2012, vol. 60, No. 10, XP011469171, ISSN: 0090-6778, DOI: 10.1109/TCOMM.2012.081012.110010, pp. 2841-2850.
Niu K., et al., "CRC-Aided Decoding of Polar Codes," IEEE Communications Letters, Oct. 2012, vol. 16, No. 10, pp. 1668-1671.
Shi L., "Research on Polar Code Characters and its Encoding and Decoding Method", Chinese Master's Theses Full-Text Database, Information Science and Technology, Issue No. 12, Dec. 15, 2015.
Qualcomm Incorporated: "LDPC Codes—HARQ, Rate", 3GPP Draft; R1-162209, LDPC_RATECOMPATIBILITY_HIGHLEVELDESIGN, 3RD Generation Partnership Project (3GPP), Mobile Competence Centre, 650, Route Des Lucioles ; F06921 Sophia-Antipolis Cedex; France, vol. RAN WG1, No. Busan, Korea; Apr. 2, 2016, XP051080037, Retrieved from the Internet: URL:http://www.3gpp.org/ftp/tsg_ran/WG1_RL1/TSGR1_84b/Docs/, 4 pages.
Qualcomm Incorporated: "LDPC Rate Compatible Design Overview", 3GPP Draft; R11610137, 3rd Generation Partnership Project (3GPP), Mobile Competence Centre, 650, Route Des Lucioles; F-06921; Sophia-Anti Polis Cedex, vol. RAN WG1. No. Lisbon, Portugal, Oct. 9, 2016, 27 pages, XP051150160, Retrieved from the Internet: URL: http://www.3gpp.org/ftp/Meetings_3GPP_SYNC/RAN1/Docs/ [retrieved on Oct. 9, 2016].
Qualcomm Incorporated: "LDPC Segmentation", 3GPP Draft; R1-1711211, LDPC Segmentation, 3rd Generation Partnership Project (3GPP), Mobile Competence Centre, 650, Route Des Lucioles, F-06921, Sophia-Antipolis Cedex, France, vol. RAN WG1, No. Qingdao, China; Jun. 27, 2017-Jun. 30, 2017, Jun. 26, 2017 (Jun. 26, 2017), XP051300410, pp. 1-6, Retrieved from the Internet: URL: http://www.3gpp.org/ftp/Meetings 3GPP SYNC/RAN1/Docs/ [retrieved on Jun. 26, 2017].
Richardson T., et al., "Design of Low-Density Parity Check Codes for 5G New Radio," IEEE Communications Magazine, vol. 56 (3), Mar. 1, 2018, pp. 28-34, XP055480192.
Shea J.M., et al., "Multidimensional Codes" In: "Wiley Encyclopedia of Telecommunications," Jan. 1, 2003, vol. 3, pp. 1538-1551, XP055402230.
TaL I., et al., "List Decoding of Polar Codes", IEEE Transactions on Information Theory, Institute of Electrical and Electronics Engineers, May 2015, vol. 61, No. 5, pp. 2213-2226.
<span style="font-family: calibri;">Guo J., et al., "Multi-CRC Polar Codes and Their Applications", IEEE Communications Letters,< span style="font-family: calibri;">Feb. 2016, vol. 20, No. 2, pp. 212-215.
Arikan E., "Challenges and some new directions in channel coding," Computer Science, Information Theory, arXiv:1504.03916, Apr. 15, 2015, 11 pages.
Leroux C., et al., "A Semi-Parallel Successive-Cancellation Decoder for Polar Codes," IEEE Transactions on Signal Processing, Jan. 2013, vol. 61, No. 2, pp. 1-11.
Mahdavifar H., et al., "Fast Multi-dimensional Polar Encoding and Decoding," Information Theory and Applications Workshop (ITA), IEEE, 2014, 5 pages.
Ericsson: "System Information for Low Complexity and Extended Coverage", 3GPP Draft; R1-1708730—Sysinfo for Low Complexity and EXT Coverage, 3rd Generation Partnership Project (3GPP), Mobile Competence Centre; 650, Route Des Lucioles; F-06921 Sophia-Antipolis Cedex; France, vol. Ran WG1, No. Hangzhou, China; 20170515 - 20170519 May 7, 2017, XP051263297, Retrieved from the Internet: URL:http://www.3gpp.org/ftp/tsg_ranNVG1_RL1/TSGR1_89/Docs/ [retrieved on May 7, 2017], 3 pages.
Nokia et al., "LDPC Design for eMBB", 3GPP Draft; R1-1705857_LDPC Design for EMBB, 3rd Generation Partnership Project (3GPP), Mobile Competence Centre; 650, Route Des Lucioles; F-06921 Sophia-Antipolis Cedex; France, vol. RAN WG1, No. Spokane, WA, USA; Apr. 3, 2017-Apr. 7, 2017 Mar. 24, 2017, XP051250965, Retrieved from the Internet: URL:http://www.3gpp.org/ftp/tsg_ran/WG1_RL1/TSGR1_88b/Docs/ [retrieved on Mar. 24, 2017], 8 pages.
Qualcomm Incorporated: "LDPC Rate Matching", 3GPP Draft; R1-1708640_LDPC RATE_MATCHING, 3rd Generation Partnership Project (3GPP), Mobile Competence Centre; 650, Route Des Lucioles; F-06921 Sophia-Antipolis Cedex; France, vol. RAN WG1, No. Hangzhou, China; May 15, 2017-May 19, 2017 May 14, 2017, XP051273827, Retrieved from the Internet: URL:http://www.3gpp.org/ftp/Meetings 3GPP SYNCE/RAN1/Docs/ [retrieved on May 14, 2017], 3 pages.
Surra S.A., et al., "Gigabit Rate Achieving Low-Power LDPC Codes: Design and Architecture", IEEE, Mar. 1, 2011, pp. 1994-1999.
Tal I., et al., "List Decoding of Polar Codes", IEEE Transactions on Information Theory, May 31, 2012, pp. 1-11.
Trifonov P., "Efficient Design and Decoding of Polar Codes", IEEE Transactions on Communications, vol. 60, No. 11, Nov. 1, 2012, XP011473857, ISSN: 0090-6778, DOI: 10.1109/TCOM.2012.081512.110872, pp. 3221-3227.
Trifonov P., et al., "Generalized Concatenated Codes based on Polar Codes", 8th International Symposium on Wireless Communication Systems, Nov. 6, 2011, XP032090122, pp. 442-446, DOI: 10.1109/ISWCS.2011.6125399, ISBN: 978-1-61284-403-9.
Trifonov P., et al., "Fast Encoding of Polar Codes with Reed-Solomon Kernel," IEEE Transactions on Communications, May 2016, pp. 1-8.
Wang T., et al., "Parity-Check-Concatenated Polar Codes", IEEE Communications Letters, IEEE Service Center, Piscataway, NJ, US, vol. 20, No. 12, Dec. 1, 2016, pp. 2342-2345, XP011636292, ISSN: 1089-7798, DOI: 10.1109/LCOMM.2016.2607169 [retrieved on Dec. 8, 2016].
Wang Y., et al., "Concatenations of Polar Codes With Outer Bch Codes and Convolutional Codes", 2014 52nd Annual Allerton Conference on Communication, Control, and Computing (Allerton), 30 Sep. 2014, pp. 813-819, XP032731136, Doi: 10.1109/Allerton.2014.7028538 [retrieved on Jan. 30, 2015].
Xie Y., et al., "Design of Rate Compatible Protograph-based LDPC Codes with Mixed Circulants", IEEE, 6th International Symposium on Turbo Codes & Iterative Information Processing, Sep. 2010, pp. 434-438.
Zhou H., et al., "Segmented CRC-Aided SC List Polar Decoding", 2016 IEEE 83rd Vehicular Technology Conference, May 15, 2016, XP032918751, pp. 1-5, DOI: 10.1109/VTCSPRING.2016.7504469, [retrieved on Jul. 5, 2016].
ZTE: "NR LDPC Design", 3GPP Draft; R1-1709289, NR LDPC design, 3rd Generation Partnership ProjecT (3GPP), Mobile Competence Centre; 650, Route Des Lucioles; F-06921, Sophia-Antipolis Cedex; France, vol. RAN WG1, No. Hangzhou, China; 20170515-20170519, May 16, 2017 (May 16, 2017), XP051285041, pp. 1-12, Retrieved from the Internet: URL: http://www.3gpp.org/ftp/tsg_ran/WG1_RL1/TSGR1_89/Docs/ [retrieved on May 16, 2017].
ZTE: "Structured LDPC Coding with Rate Matching", 3GPP Draft; R1-060115, Mobile Competence Centre ; 650, Route Des Lucioles; F-06921 Sophia-Antipolis Cedex; France, vol. RAN WG1, No. Helsinki, Finland; Jan. 19, 2006, XP050950962, Retrieved from the

(56) References Cited

OTHER PUBLICATIONS

Internet: URL:http://www.3gpp.org/ftp/tsg_ran/WG1_RLUTSGR1_AH/LTE_AH_0601/Docs/, 13 pages.
Qualcomm Incorporated: "LDPC Design Overview", 3GPP TSG-RAN WG1#85, R1164697, May 2016, pp. 1-5, URL: http://www.3gpp.org/ftp/tsg_ran/WG1 RL1/TSGR1_812/Docs/R1-164697.zip.
Richardson T., et al., "LDPC Proposal Update", 3GPP2-Drafts, Dec. 18, 2006 (Dec. 18, 2006), pp. 1-30, XP040476671, ftp://ftp.3gpp2.org/TSGC/Working/2007/2007-01-Vancouver/TSG-C-2007-01-Vancouver/WG3/Distribution%0202006.12.18/C30-20061218-004 QCOM LDPC proposal update.pdf.
Stolte N., Rekursive Codes mit der Plotkin-Konstruktion and ihre Decodierung, D17 Darmstadter Dissertation, Jan. 1, 2002, 151 pages, (in particular, pp. 13-30), XP055241445, URL:http:I/tuprints.ulb.tu-darmstadt.de/epda/000183/stolte.pdf, Techn. Universitat, Diss., 2002 (Nicht f. d. Austausch)_Darmstadt [retrieved on Jan. 14, 2016].
Examiner Requisition for CA03021881 dated Nov. 7, 2018.
Examiner Requisition for CA03021881 dated Jan. 28, 2019..
Qualcomm Incorporated: "Polar code design overview", 3GPP Draft, 3GPP TSG-RAN WG1 #85, R1-164699_POLAR_DESIGN_OVERVIEW, 3RD Generation Partnership Project (3GPP), Mobile Competence Centre, 550, Route Des Lucioles, F-06921 Sophia-Antipolis Cedex, France, vol. RAN WG1, No. Nanjing, China, May 23, 2016-May 27, 2016 May 14, 2016 (May 14, 2016), XP051089936, 3 pages, Retrieved from the Internet:URL:http://www.3gpp.org/ftp/tsg_ran/WG1_RL1/TSGR1_85/Docs/ [retrieved on May 14, 2016].
Ericsson: "Implementation and Performance of LDPC Decoder", 3GPP TSG RAN WG1 AH_NR Meeting R1-1700111, Jan. 20, 2017, 8 Pages.
Huawei: "Details of the Polar code design", 3GPP TSAN RAN WG1 Meeting #87, R1-1611254, Reno, USA, Nov. 10-14, 2016, 15 pages.
Intel Corporation: "LDPC Code Design for NR", 3GPP TSG RAN WG1 Meeting #85, 3GPP Draft; R1-164183, 3rd Generation Partnership Project (3GPP), Mobile Competence Centre; 650, Route Des Lucioles; F-06921 Sophia-Cedex; France, vol. RAN WG1, No. Nanjing, China; May 23, 2016-May 27, 2016, May 14, 2016 (May 14, 2016), 4 Pages, XP051090075, Retrieved from the Internet: URL: http://www.3gpp.org/ftp/tsg_ran/WG1_RL1/TSGR1_85/Docs/ [retrieved on May 14, 2016] p. 1-p. 3.
Intel Corporation: "LDPC Coding Chain" [online], 3GPP Draft, 3GPP TSG RAN WG1 Meeting NR-Adhoc#2, R1-1711344, 3rd Generation Partnership Project (3GPP), Mobile Competence Centre, 650, Route Des Lucioles, 7-06921 Sophia-Antipolis Cedex, France, vol. RAN WG1, No. Qingdao, P.R. China, Jun. 27, 2017-Jun. 30, 2017, Jun. 20, 2017 (Jun. 20, 2017), XP051305812, pp. 1-6, Retrieved from the Internet: URL: http://www.3gpp.org/ftp/tsg_ran/WG1_RL1/TSGR1_AH/NR_AH_1706/Docs/ [retrieved on Jun. 20, 2017].
Nokia: "Rate Matching for LDPC" [online], 3GPP TSG RAN WG1 NR Ad-Hoc#2, R1-1711536, Jun. 19, 2017, 5 Pages, Internet URL: http://www.3gpp.org/ftp/tsg_ranNVG1_RL1/TSGR1_AH/NR_AH_1706/Docs/R1-1711536.zip. (In particular, refer to Section 2).
Qualcomm Incorporated: "LDPC Rate Compatible Design" [online], 3GPP TSG-RAN WG1 #89, R1-1709181, May 13, 2017, pp. 1-11, Retrieved from the Internet: URL:http://www.3gpp.org/ftp/tsg_ranNVG1_RL1/TSGR1_89/Docs/ R1-1709181.zip. (In particular, refer to Section 1).
Samsung: "Flexibility of LDPC—Length, Rate and IR-HARQ", R1-164007, 3GPP TSG RAN WG1 #85, Nanjing, China, May 23-27, 2016, 8 Pages.
Samsung: "Preliminary evaluation results on new channel coding scheme for NR-LDPC code for high throughput", 3GPP TSG-RAN WG1#85, R1-164812, May 14, 2016, 17 Pages.
Nokia: "Alcatel-Lucent Shanghai Bell Performance and complexity of Turbo, LDPC and Polar codes", 3GPP TSG-RAN WG1 #84bis, R1-162897, Apr. 11-15, 2021 pp. 1-5.
ZTE et al., "Compact LDPC Design for eMBB", 3GPP Draft, 3GPP TSG RAN WG1 AH NR Meeting, R1-1700247 compact LDPC Design for EMBB_Final, 3RD Generation Partnership Project (3GPP), Mobile Competence Centre, 350, Route Des Lucioles, F-06921 Sophia-Antipolis Cedex, France, vol. Ran WG1. No. Spokane, USA, 20170116-017012O Jan. 10, 2017 (Jan. 10, 2017), XP051202750, pp. 1-16, Retrieved from the Internet: URL:http://www.3gpp. wg/ftp/tsg_ran/WG1_RL1/TSGR1_AH/NR_AH_1701/Docs/ [retrieved on-Jan. 20, 2017] p. 1-p. 13.

\* cited by examiner

METHODS AND APPARATUS FOR EFFICIENTLY GENERATING MULTIPLE LIFTED LOW-DENSITY PARITY-CHECK (LDPC) CODES

CROSS-REFERENCE TO RELATED APPLICATION & PRIORITY CLAIM

This application claims benefit of and priority to U.S. Provisional Patent Application Ser. No. 62/334,977, filed May 11, 2016, which is herein incorporated by reference in its entirety for all applicable purposes.

FIELD OF THE DISCLOSURE

Certain aspects of the present disclosure generally relate to wireless communications and detecting and/or correcting errors in binary data and, more particularly, to methods and apparatus for efficiently generating multiple lifted low-density parity-check (LDPC) codes.

DESCRIPTION OF RELATED ART

Wireless communication systems are widely deployed to provide various types of communication content such as voice, video, data, messaging, broadcasts, and so on. These systems may employ multiple-access technologies capable of supporting communication with multiple users by sharing available system resources (e.g., bandwidth and transmit power). Examples of such multiple-access systems include code division multiple access (CDMA) systems, time division multiple access (TDMA) systems, time division synchronous CDMA (TD-SCDMA) systems, frequency division multiple access (FDMA) systems, single-carrier FDMA (SC-FDMA) systems, $3^{rd}$ Generation Partnership Project (3GPP) long term evolution (LTE) systems, LTE Advanced (LTE-A) systems, and orthogonal frequency division multiple access (OFDMA) systems.

These multiple access technologies have been adopted in various telecommunication standards to provide a common protocol that enables different wireless devices to communicate on a municipal, national, regional, and even global level. An example of an emerging telecommunication standard is new radio (NR), for example, 5G radio access. NR is a set of enhancements to the LTE mobile standard promulgated by 3GPP. It is designed to better support mobile broadband Internet access by improving spectral efficiency, lowering costs, improving services, making use of new spectrum, and better integrating with other open standards using OFDMA with a cyclic prefix (CP) on the downlink (DL) and on the uplink (UL) as well as support beamforming, multiple-input multiple-output (MIMO) antenna technology, and carrier aggregation.

Generally, a wireless multiple-access communication system can simultaneously support communication for multiple wireless nodes. Each node communicates with one or more base stations via transmissions on forward and reverse links. The forward link (or downlink) refers to a communication link from base stations to nodes, and a reverse link (or uplink) refers to a communication link from nodes to base stations. Communication links may be established via a single-input single-output, multiple-input single-output, or a multiple-input multiple-output (MIMO) system.

In some examples, a wireless multiple-access communication system may include a number of BSs, each simultaneously supporting communication for multiple communication devices, otherwise known as user equipment (UEs). In an LTE or LTE-A network, a set of one or more BSs may define an e NodeB (eNB). In other examples (e.g., in a next generation, NR, or 5G network), a wireless multiple access communication system may include a number of distributed units (DUs) (e.g., edge units (EUs), edge nodes (ENs), radio heads (RHs), smart radio heads (SRHs), transmission reception points (TRPs), etc.) in communication with a number of central units (CUs) (e.g., central nodes (CNs), access node controllers (ANCs), etc.), where a set of one or more DUs, in communication with a CU, may define an access node (e.g., a BS, a NR BS, a 5G BS, a NB, an eNB, NR NB, a 5G NB, an access point (AP), a network node, a gNB, a TRP, etc.). A BS, AN, or DU may communicate with a UE or a set of UEs on downlink channels (e.g., for transmissions from a BS or to a UE) and uplink channels (e.g., for transmissions from a UE to a BS, AN, or DU).

In the modern information age, binary values (e.g., ones and zeros), are used to represent and communicate various types of information, such as video, audio, statistical information, etc. Unfortunately, during storage, transmission, and/or processing of binary data, errors may be unintentionally introduced; for example, a "1" may be changed to a "0" or vice versa.

Generally, in the case of data transmission, a receiver observes each received bit in the presence of noise or distortion and only an indication of the bit's value is obtained. Under these circumstances, the observed values are interpreted as a source of "soft" bits. A soft bit indicates a preferred estimate of the bit's value (e.g., a 1 or a 0) together with some indication of the reliability of that estimate. While the number of errors may be relatively low, even a small number of errors or level of distortion can result in the data being unusable or, in the case of transmission errors, may necessitate retransmission of the data. In order to provide a mechanism to check for errors and, in some cases, to correct errors, binary data can be coded to introduce carefully designed redundancy. Coding of a unit of data produces what is commonly referred to as a codeword. Because of its redundancy, a codeword will often include more bits than the input unit of data from which the codeword was produced.

Redundant bits are added by an encoder to the transmitted bitstream to create a codeword. When signals arising from transmitted codewords are received or processed, the redundant information included in the codeword as observed in the signal can be used to identify and/or correct errors in or remove distortion from the received signal in order to recover the original data unit. Such error checking and/or correcting can be implemented as part of a decoding process. In the absence of errors, or in the case of correctable errors or distortion, decoding can be used to recover from the source data being processed, the original data unit that was encoded. In the case of unrecoverable errors, the decoding process may produce some indication that the original data cannot be fully recovered. Such indications of decoding failure can initiate retransmission of the data. As the use of fiber optic lines for data communication and the rate at which data can be read from and stored to data storage devices (e.g., disk drives, tapes, etc.) increases, there is an increasing need for efficient use of data storage and transmission capacity but also for the ability to encode and decode data at high rates.

While encoding efficiency and high data rates are important, for an encoding and/or decoding system to be practical for use in a wide range of devices (e.g., consumer devices), it is also important that the encoders and/or decoders can be implemented at reasonable cost.

Communication systems often need to operate at several different rates. Low-density-parity check (LDPC) codes are one option for a simple implementation that provides coding and decoding at different rates. For example, higher-rate LDPC codes can be generated by puncturing lower-rate LDPC codes.

As the demand for mobile broadband access continues to increase, there exists a need for further improvements in NR technology. Preferably, these improvements should be applicable to other multi-access technologies and the telecommunication standards that employ these technologies. One area for improvements is the area of encoding/decoding, applicable to NR. For example, techniques for high performance LDPC codes for NR are desirable.

BRIEF SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved communications between access points and stations in a wireless network.

Certain aspects of the present disclosure generally relate to methods and apparatus for efficiently generating multiple lifted low-density parity-check (LDPC) codes.

Certain aspects of the present disclosure provide a method for wireless communications that may be performed by a transmitting device. The method generally includes selecting one or more integer lifting values for generating a first lifted LDPC code having a first lifting size value Z, comprising Z copies of a base LDPC code defined by a base matrix having a first number of base variable nodes and a second number of base check nodes, wherein the first lifting size value is selected from a range of lifting size values, and wherein the selected one or more integer lifting values is greater than a maximum lifting size value of the range of lifting size values; determining one or more integer lifting values for generating at least a second lifted LDPC code having a second lifting size value based on an operation involving the second lifting size value and the selected one or more integer lifting values for generating the first lifted LDPC code; encoding a set of information bits based on the second lifted LDPC to produce a code word; and transmitting the code word.

Certain aspects of the present disclosure provide an apparatus for wireless communications such as a transmitting device. The apparatus generally includes means for selecting one or more integer lifting values for generating a first lifted LDPC code having a first lifting size value Z, comprising Z copies of a base LDPC code defined by a base matrix having a first number of base variable nodes and a second number of base check nodes, wherein the first lifting size value is selected from a range of lifting size values, and wherein the selected one or more integer lifting values is greater than a maximum lifting size value of the range of lifting size values; means for determining one or more integer lifting values for generating at least a second lifted LDPC code having a second lifting size value based on an operation involving the second lifting size value and the selected one or more integer lifting values for generating the first lifted LDPC code; means for encoding a set of information bits based on the second lifted LDPC to produce a code word; and means for transmitting the code word.

Certain aspects of the present disclosure provide an apparatus for wireless communications such as a wireless device. The apparatus generally includes at least one processor coupled with a memory and configured to select one or more integer lifting values for generating a first lifted LDPC code having a first lifting size value Z, comprising Z copies of a base LDPC code defined by a base matrix having a first number of base variable nodes and a second number of base check nodes, wherein the first lifting size value is selected from a range of lifting size values, and wherein the selected one or more integer lifting values is greater than a maximum lifting size value of the range of lifting size values; determine one or more integer lifting values for generating at least a second lifted LDPC code having a second lifting size value based on an operation involving the second lifting size value and the selected one or more integer lifting values for generating the first lifted LDPC code; and encode a set of information bits based on the second lifted LDPC to produce a code word. The apparatus also include a transmitter configured to transmit the code word.

Certain aspects of the present disclosure provide a computer readable medium having computer executable code stored thereon. The code generally includes code for selecting one or more integer lifting values for generating a first lifted LDPC code having a first lifting size value Z, comprising Z copies of a base LDPC code defined by a base matrix having a first number of base variable nodes and a second number of base check nodes, wherein the first lifting size value is selected from a range of lifting size values, and wherein the selected one or more integer lifting values is greater than a maximum lifting size value of the range of lifting size values; code for determining one or more integer lifting values for generating at least a second lifted LDPC code having a second lifting size value based on an operation involving the second lifting size value and the selected one or more integer lifting values for generating the first lifted LDPC code; code for encoding a set of information bits based on the second lifted LDPC to produce a code word; and code for transmitting the code word.

Other aspects, features, and embodiments of the present disclosure will become apparent to those of ordinary skill in the art, upon reviewing the following description of specific, exemplary aspects of the present disclosure in conjunction with the accompanying figures. While features of the present disclosure may be discussed relative to certain aspects and figures below, all aspects of the present disclosure can include one or more of the advantageous features discussed herein. In other words, while one or more aspects may be discussed as having certain advantageous features, one or more of such features may also be used in accordance with the various aspects of the disclosure discussed herein. In similar fashion, while exemplary aspects may be discussed below as device, system, or method embodiments it should be understood that such exemplary embodiments can be implemented in various devices, systems, and methods.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. The appended drawings illustrate only certain typical aspects of this disclosure, however, and are therefore not to be considered limiting of its scope, for the description may admit to other equally effective aspects.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
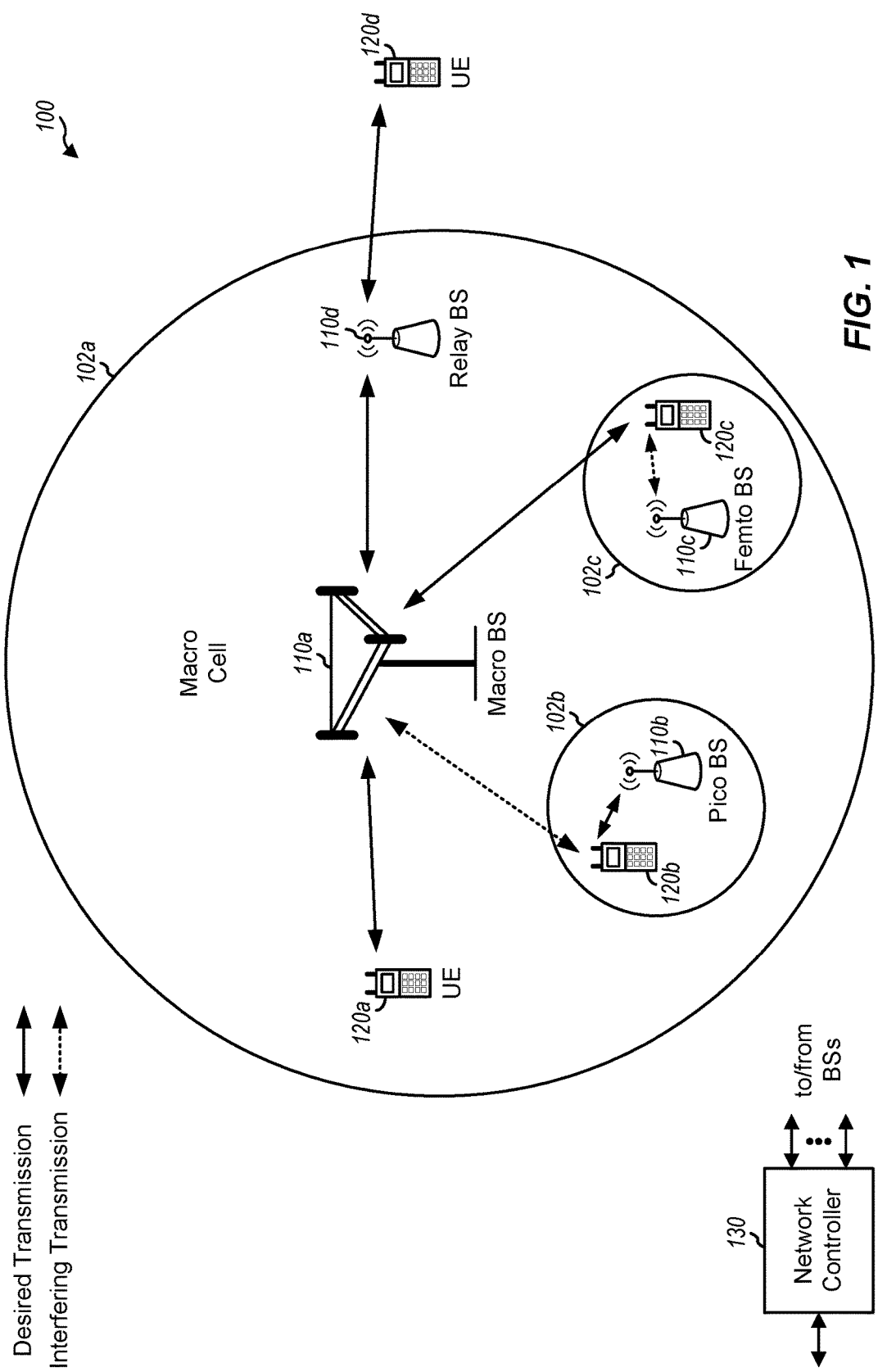
FIG. 1 is a block diagram illustrating an example wireless communication network, in accordance with certain aspects of the present disclosure.

Aspects of the present disclosure provide apparatus, methods, processing systems, and computer program products for encoding (and/or decoding) for new radio (NR) access technology (e.g., 5G radio access). NR may refer to radios configured to operate according to a new air interface or fixed transport layer. NR may include support for enhanced mobile broadband (eMBB) service targeting wide bandwidth (e.g., 80 MHz and beyond), millimeter wave (mmW) service targeting high carrier frequency (e.g., 60 GHz), massive machine type communications (mMTC) service targeting non-backward compatible MTC techniques, and/or mission critical (MiCr) service targeting ultra-reliable low-latency communications (URLLC) service. These services may include latency and reliability requirements. NR may use low-density parity-check (LDPC) coding and/or polar codes.

Aspects of the present disclosure provide techniques and apparatus for efficiently generating multiple lifted LDPC codes. The LDPC codes can be generated based on an operation (e.g., a modulo operation) of the lifting size and involving an integer lifting value is the integer lifting value may be much larger than the maximum lifting size for the range of lifted LDPC codes. For example, a set of values can be selected such that the result of the modulo operations is always non-zero. Thereby, only the selected integers may be stored, and the lifted LDPC code for any lifting size within the range of liftings may be generated using the selected integers in the modulo operation.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

The techniques described herein may be used for various wireless communication networks such as Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms "networks" and "systems" are often used interchangeably. A CDMA network may implement a radio technology such as Universal Terrestrial Radio Access (UTRA), CDMA2000, etc. UTRA includes Wideband- CDMA (W-CDMA) and Low Chip Rate (LCR). CDMA2000 covers IS-2000, IS-95, and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). 3GPP LTE and LTE-Advanced (LTE-A) are releases of UMTS that use E-UTRA. UTRA, E-UTRA, UMTS, LTE, LTE-A and GSM are described in documents from an organization named "3rd Generation Partnership Project" (3GPP). CDMA2000 is described in documents from an organization named "3rd Generation Partnership Project 2" (3GPP2). These communications networks are merely listed as examples of networks in which the techniques described in this disclosure may be applied; however, this disclosure is not limited to the above-described communications network. For clarity, it is noted that while aspects may be described herein using terminology commonly associated with 3G and/or 4G wireless technologies, aspects of the present disclosure can be applied in other generation-based communication systems, such as new radio (NR) technologies including 5G and later.

An Example Wireless Communication System

FIG. 1 illustrates an example wireless communications network 100 in which aspects of the present disclosure may be performed. For example, a transmitting device such as a user equipment (UE) 120 or a bases station (BS) 110 can obtain an integer value to be used for generating multiple lifted low-density parity-check (LDPC) codes comprising Z copies of a base LDPC code defined by a base matrix having a first number of base variable nodes and a second number of base check nodes, wherein a value of the lifting size Z is selected from a range of lifting size values and the integer value is greater than a maximum lifting size value of the range of values of Z. The transmitting device can then generate lifted LDPC codes based on an operation involving Z and the integer value. The transmitting encodes a set of information bits based on the generated LDPC codes to produce a code word and then transmits the code word As illustrated in FIG. 1, wireless communications network 100 may include a number of BSs 110 and other network entities. A BS may be a station that communicates with UEs. Each BS 110 may provide communication coverage for a particular geographic area. In 3GPP, the term "cell" can refer to a coverage area of a Node B and/or a Node B subsystem serving this coverage area, depending on the context in which the term is used. In NR systems, the term "cell" and gNB, Node B, 5G NB, AP, NR BS, NR BS, TRP, etc., may be interchangeable. In some examples, a cell may not necessarily be stationary, and the geographic area of the cell may move according to the location of a mobile BS. In some examples, the BSs may be interconnected to one another and/or to one or more other BSs or network nodes (not shown) in wireless communications network 100 through various types of backhaul interfaces such as a direct physical connection, a virtual network, or the like using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a frequency channel, etc. Each frequency may support a single RAT in a given geographic area in order to avoid interference between wireless networks of different RATs. In some cases, NR or 5G RAT networks may be deployed.

A BS may provide communication coverage for a macro cell, a pico cell, a femto cell, and/or other types of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a Closed Subscriber Group (CSG), UEs for users in the home, etc.). A BS for a macro cell may be referred to as a macro BS. A BS for a pico cell may be referred to as a pico BS. A BS for a femto cell may be referred to as a femto BS or a home BS. In the example shown in FIG. 1, BS 110a, BS 110b, and BS 110c may be macro BSs for the macro cell 102a, macro cell 102b, and macro cell 102c, respectively. A BS may support one or multiple (e.g., three) cells.

Wireless communications network 100 may also include relay stations. A relay station is a station that receives a transmission of data and/or other information from an upstream station (e.g., a BS 110 or a UE 120) and sends a transmission of the data and/or other information to a downstream station (e.g., a UE 120 or a BS 110). A relay station may also be a UE that relays transmissions for other UEs. In the example shown in FIG. 1, relay station 110r may communicate with BS 110a and UE 120r in order to facilitate communication between BS 110a and UE 120r. A relay station may also be referred to as a relay, a relay eNB, etc.

Wireless communications network 100 may be a heterogeneous network that includes BSs of different types, for example, macro BS, pico BS, femto BS, relays, etc. These different types of BSs may have different transmit power levels, different coverage areas, and different impact on interference in the wireless communications network 100. For example, a macro BS may have a high transmit power level (e.g., 20 Watts) whereas pico BS, femto BS, and relays may have a lower transmit power level (e.g., 1 Watt).

Wireless communications network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

Network controller 130 may couple to a set of BSs and provide coordination and control for these BSs. Network controller 130 may communicate with BSs 110 via a backhaul. BSs 110 may also communicate with one another, e.g., directly or indirectly via wireless or wireline backhaul.

UEs 120 (e.g., UE 120a, UE 120b, etc.) may be dispersed throughout wireless communications network 100, and each UE may be stationary or mobile. A UE may also be referred to as a mobile station, a terminal, an access terminal, a subscriber unit, a station, a Customer Premises Equipment (CPE), a cellular phone, a smart phone, a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or medical equipment, a biometric sensor/device, a wearable device such as a smart watch, smart clothing, smart glasses, a smart wrist band, smart jewelry (e.g., a smart ring, a smart bracelet, etc.), an entertainment device (e.g., a music device, a video device, a satellite radio, etc.), a vehicular component or sensor, a smart meter/sensor, industrial manufacturing equipment, a global positioning system device, or any other suitable device that is configured to communicate via a wireless or wired medium. Some UEs may be considered evolved or machine-type communication (MTC) devices or evolved MTC (eMTC) devices. MTC and eMTC UEs include, for example, robots, drones, remote devices, sensors, meters, monitors, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices.

In FIG. 1, a solid line with double arrows indicates desired transmissions between a UE and a serving BS, which is a BS designated to serve the UE on the downlink and/or uplink. A finely dashed line with double arrows indicates interfering transmissions between a UE and a BS.

Certain wireless networks (e.g., LTE) utilize orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz and the minimum resource allocation (called a "resource block" (RB)) may be 12 subcarriers (i.e., 180 kHz). Consequently, the nominal Fast Fourier Transform (FFT) size may be equal to 128, 256, 512, 1024 or 2048 for system bandwidth of 1.25 MHz, 2.5 MHz, 5 MHz, 10 MHz, or 20 MHz, respectively. The system bandwidth may also be partitioned into subbands. For example, a subband may cover 1.08 MHz (i.e., 6 RBs), and there may be 1, 2, 4, 8 or 16 subbands for system bandwidth of 1.25 MHz, 2.5 MHz, 5 MHz, 10 MHz, or 20 MHz, respectively.

While aspects of the examples described herein may be associated with LTE technologies, aspects of the present disclosure may be applicable with other wireless communications systems, such as NR.

NR may utilize OFDM with a CP on the uplink and downlink and include support for half-duplex operation using TDD. A single component carrier bandwidth of 100 MHz may be supported. NR RBs may span 12 subcarriers with a subcarrier bandwidth of 75 kHz over a 0.1 ms duration. Each radio frame may consist of 50 subframes with a length of 10 ms. Consequently, each subframe may have a length of 0.2 ms. Each subframe may indicate a link direction (i.e., downlink or uplink) for data transmission and the link direction for each subframe may be dynamically switched. Each subframe may include DL/UL data as well as DL/UL control data. UL and DL subframes for NR may be as described in more detail below with respect to FIGS. 6 and 7. Beamforming may be supported and beam direction may be dynamically configured. MIMO transmissions with precoding may also be supported. MIMO configurations in the DL may support up to 8 transmit antennas with multilayer DL transmissions up to 8 streams and up to 2 streams per UE. Multi-layer transmissions with up to 2 streams per UE may be supported. Aggregation of multiple cells may be supported with up to 8 serving cells. Alternatively, NR may support a different air interface, other than an OFDM-based.

In some examples, access to the air interface may be scheduled, wherein a scheduling entity (e.g., a BS 110 or UE 120) allocates resources for communication among some or all devices and equipment within its service area or cell. Within the present disclosure, as discussed further below, the scheduling entity may be responsible for scheduling, assigning, reconfiguring, and releasing resources for one or more subordinate entities. That is, for scheduled communication, subordinate entities utilize resources allocated by the scheduling entity. BSs are not the only entities that may function as a scheduling entity. That is, in some examples, a UE may function as a scheduling entity, scheduling resources for one or more subordinate entities (e.g., one or more other UEs). In this example, the UE is functioning as a scheduling entity, and other UEs utilize resources scheduled by the UE for wireless communication. A UE may function as a scheduling entity in a peer-to-peer (P2P) network, and/or in a mesh network. In a mesh network example, UEs may optionally communicate directly with one another in addition to communicating with the scheduling entity.

Thus, in a wireless communication network with a scheduled access to time-frequency resources and having a cellular configuration, a P2P configuration, and a mesh configuration, a scheduling entity and one or more subordinate entities may communicate utilizing the scheduled resources.

The NR radio access network (RAN) may include one or more central units (CU) and distributed units (DUs). A NR BS (e.g., a gNB, a 5G NB, a NB, a 5G NB, a TRP, an AP) may correspond to one or multiple BSs. NR cells can be configured as access cells (ACells) or data only cells (DCells). DCells may be cells used for carrier aggregation or dual connectivity, but not used for initial access, cell selection/reselection, or handover.

Figure 2:
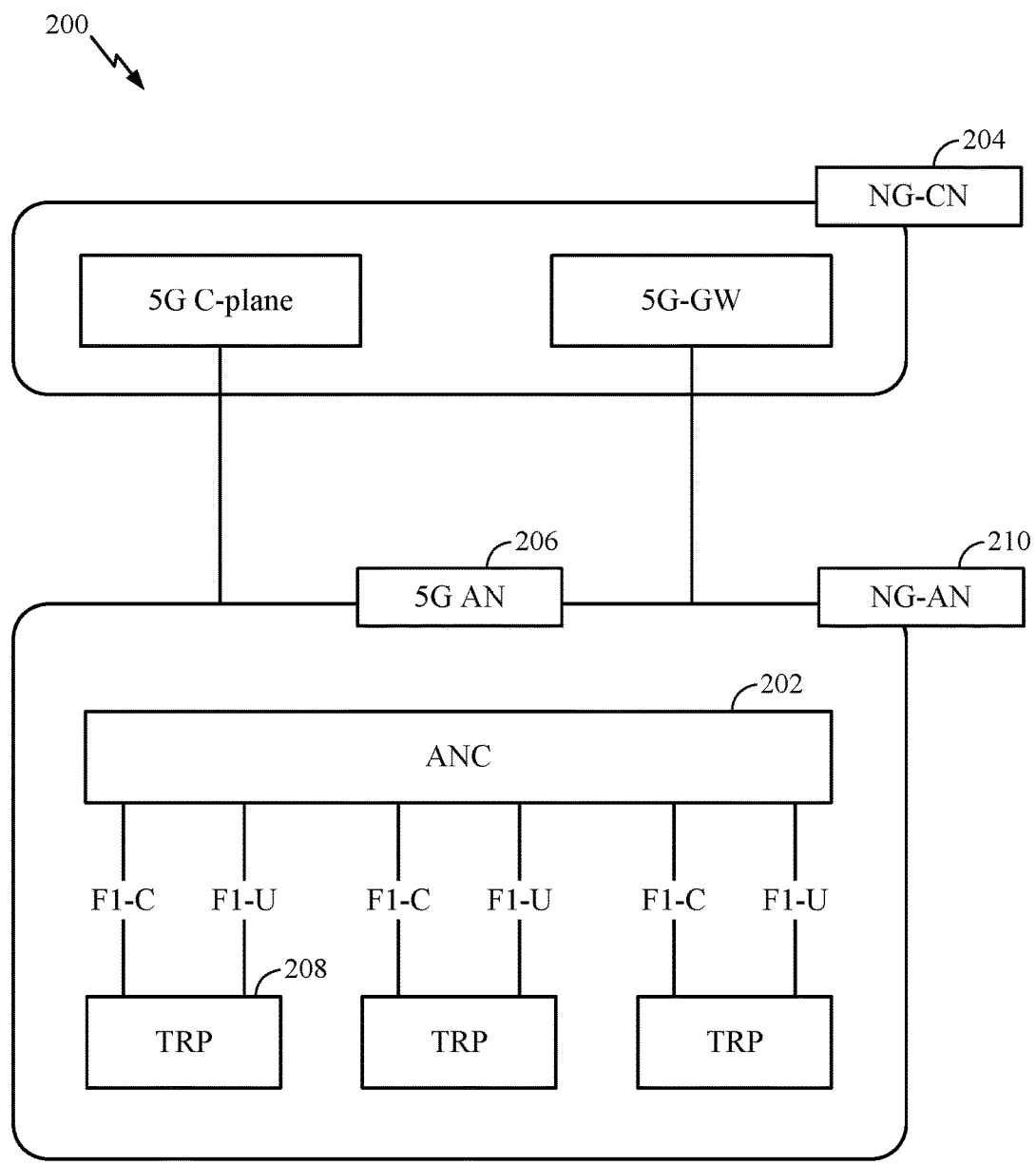
FIG. 2 is a block diagram illustrating an example logical architecture of a distributed radio access network (RAN), in accordance with certain aspects of the present disclosure.

FIG. 2 illustrates an example logical architecture of a distributed RAN 200, which may be implemented in wireless communications system 100 illustrated in FIG. 1. 5G access node (AN) 206 may include access node controller (ANC) 202. ANC 202 may be a CU of distributed RAN 200. A backhaul interface to next generation core network (NG-CN) 204 may terminate at ANC 202. A backhaul interface to neighboring next generation access nodes (NG-ANs) may terminate at ANC 202. ANC 202 may include one or more TRPs 208.

TRPs 208 comprise DUs. TRPs 208 may be connected to one ANC (ANC 202) or more than one ANC (not illustrated). For example, for RAN sharing, radio as a service (RaaS), and service specific AND deployments, the TRP may be connected to more than one ANC 202. A TRP 208 may include one or more antenna ports. TRPs 208 may be configured to individually (e.g., dynamic selection) or jointly (e.g., joint transmission) serve traffic to a UE (e.g., a UE 120).

Example logical architecture of the distributed RAN 200 may be used to illustrate fronthaul definition. The logical architecture may support fronthauling solutions across different deployment types. For example, the logical architecture may be based on transmit network capabilities (e.g., bandwidth, latency, and/or jitter). The logical architecture may share features and/or components with LTE. NG-AN 210 may support dual connectivity with NR. NG-AN 210 may share a common fronthaul for LTE and NR. The logical architecture may enable cooperation between and among TRPs 208. For example, cooperation may be pre-configured within a TRP 208 and/or across TRPs 208 via ANC 202. There may be no inter-TRP interface.

The logical architecture for distributed RAN 200 may include a dynamic configuration of split logical functions. As will be described in more detail with reference to FIG. 5, the Radio Resource Control (RRC) layer, Packet Data Convergence Protocol (PDCP) layer, Radio Link Control (RLC) layer, Medium Access Control (MAC) layer, and a Physical (PHY) layers may be placed at the DU (e.g., a TRP 208) or the CU (e.g., ANC 202).

Figure 3:
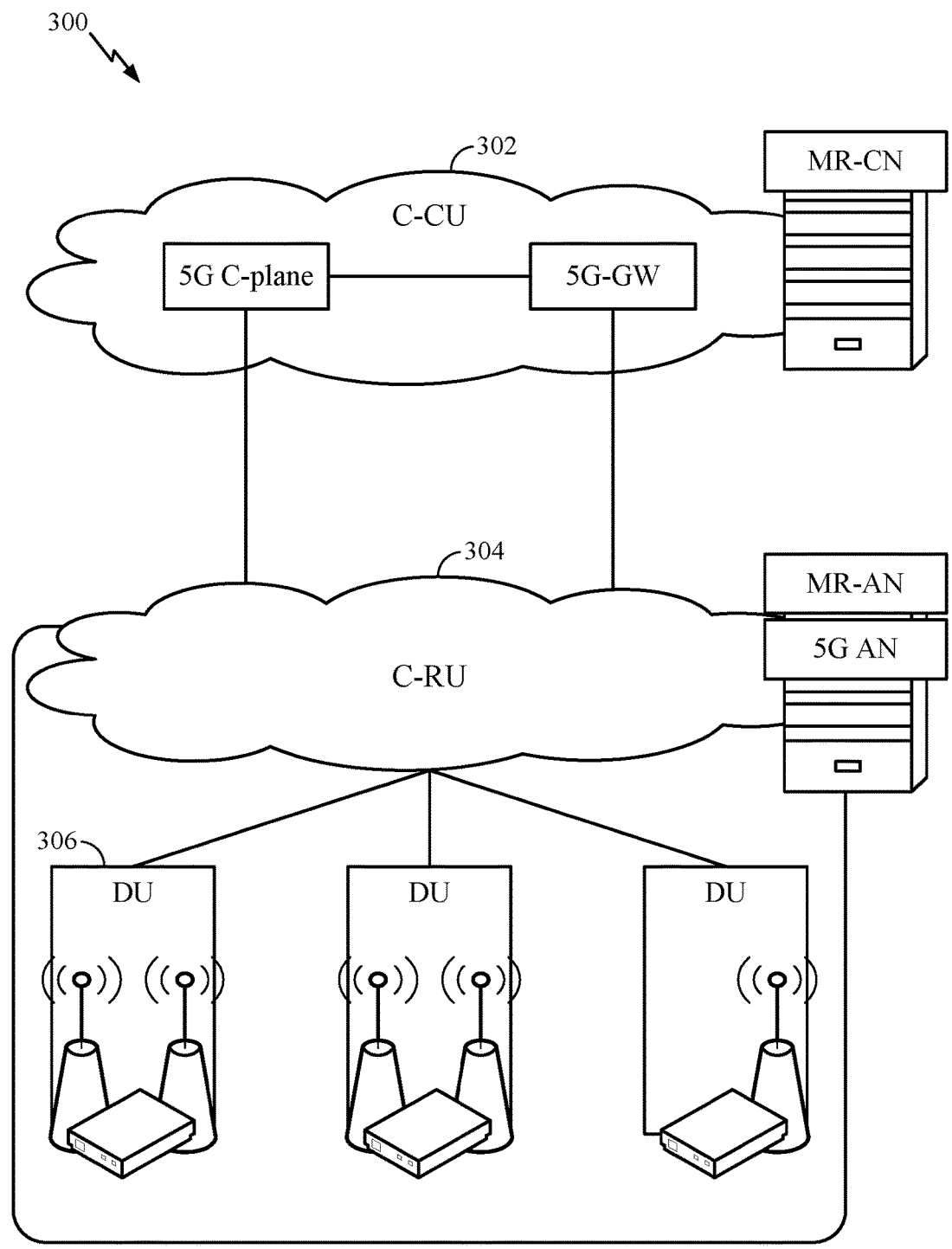
FIG. 3 is a diagram illustrating an example physical architecture of a distributed RAN, in accordance with certain aspects of the present disclosure.

FIG. 3 illustrates an example physical architecture of a distributed RAN 300, according to aspects of the present disclosure. As shown in FIG. 3, distributed RAN 300 includes centralized core network unit (C-CU) 302, centralized RAN unit (C-RU) 304, and DU 306.

C-CU 302 may host core network functions. C-CU 302 may be centrally deployed. C-CU 302 functionality may be offloaded (e.g., to advanced wireless services (AWS)), in an effort to handle peak capacity. C-RU 304 may host one or more ANC functions. Optionally, C-RU 304 may host core network functions locally. C-RU 304 may have a distributed deployment. C-RU 304 may be located near an edge the network. DU 306 may host one or more TRPs (edge node (EN), an edge unit (EU), a radio head (RH), a smart radio head (SRH), or the like). DU 306 may be located at edges of the network with radio frequency (RF) functionality.

Figure 4:
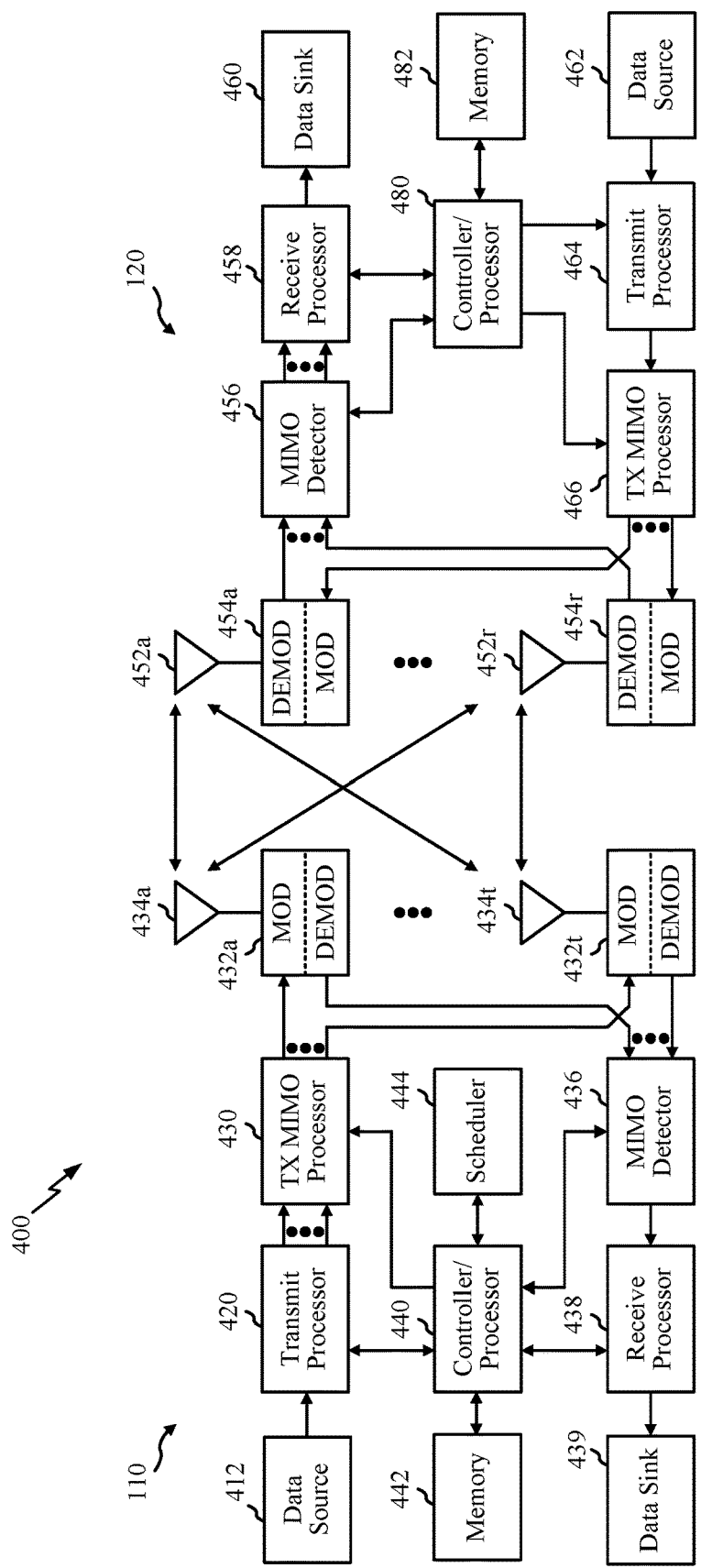
FIG. 4 is a block diagram illustrating a design of an example base station (BS) and user equipment (UE), in accordance with certain aspects of the present disclosure.

FIG. 4 illustrates example components of the BS 110 and the UE 120 illustrated in FIG. 1, which may be used to implement aspects of the present disclosure for high performance, flexible, and compact LDPC coding. One or more of the components of BS 110 and UE 120 illustrated in FIG. 4 may be used to practice aspects of the present disclosure. For example, antenna(s) 452a-454r, Demodulator(s)/Modulator(s) 454a-454r, TX MIMO processor 466, Receive Processor 458, Transmit Processor 464, and/or Controller/Processor 480 of UE 120 and/or antenna(s) 434a-434t, Demodulator(s)/Modulator(s) 432a-434t, TX MIMO Processors 430, Transmit Processor 420, Receive Processor 438, and/or Controller/Processor 440 of BS 110 may be used to perform the operations 1300-1500, 2400, and 2500 described herein and illustrated with reference to FIG. 13.

For a restricted association scenario, BS 110 may be macro BS 110c in FIG. 1, and UE 120 may be UE 120a. BS 110 may also be a BS of some other type. BS 110 may be equipped with antennas 434a through 434t and UE 120 may be equipped with antennas 452a through 452r.

At BS 110, transmit processor 420 may receive data from data source 412 and control information from controller/processor 440. The control information may be for the Physical Broadcast Channel (PBCH), Physical Control Format Indicator Channel (PCFICH), Physical Hybrid ARQ Indicator Channel (PHICH), Physical Downlink Control Channel (PDCCH), or other control channel or signal. The data may be for the Physical Downlink Shared Channel (PDSCH), or other data channel or signal. Transmit processor 420 may process (e.g., encode and symbol map) the data and control information to obtain data symbols and control symbols, respectively. For example, transmit processor 420 may encode the information bits using LPDC code designs discussed in greater detail below. Transmit processor 420 may also generate reference symbols, for example, for the primary synchronization signal (PSS), secondary synchronization signal (SSS), and cell-specific reference signal (CRS). Transmit (TX) multiple-input multiple-output (MIMO) processor 430 may perform spatial processing (e.g., precoding) on the data symbols, the control symbols, and/or the reference symbols, if applicable, and may provide output symbol streams to the modulators (MODs) 432a through 432t. Each modulator 432 may process a respective output symbol stream (e.g., for OFDM, etc.) to obtain an output sample stream. Each modulator 432 may further process (e.g., convert to analog, amplify, filter, and upconvert) the output sample stream to obtain a downlink signal. Downlink signals from modulators 432a through 432t may be transmitted via antennas 434a through 434t, respectively.

At UE 120, antennas 452a through 452r may receive the downlink signals from BS 110 and may provide received signals to the demodulators (DEMODs) 454a through 454r, respectively. Each demodulator 454 may condition (e.g., filter, amplify, downconvert, and digitize) a respective received signal to obtain input samples. Each demodulator 454 may further process the input samples (e.g., for OFDM, etc.) to obtain received symbols. MIMO detector 456 may obtain received symbols from all the demodulators 454a through 454r, perform MIMO detection on the received symbols if applicable, and provide detected symbols. Receive processor 458 may process (e.g., demodulate, deinterleave, and decode) the detected symbols, provide decoded data for UE 120 to a data sink 460, and provide decoded control information to controller/processor 480.

On the uplink, at UE 120, transmit processor 464 may receive and process data (e.g., for the Physical Uplink Shared Channel (PUSCH) or other data channel or signal) from data source 462 and control information (e.g., for the Physical Uplink Control Channel (PUCCH) or other control channel or signal) from controller/processor 480. Transmit processor 464 may also generate reference symbols for a reference signal. The symbols from transmit processor 464 may be precoded by TX MIMO processor 466 if applicable, further processed by demodulators 454a through 454r (e.g., for SC-FDM, etc.), and transmitted to BS 110. At BS 110, the uplink signals from the UE 120 may be received by antennas 434, processed by modulators 432, detected by MIMO detector 436 if applicable, and further processed by receive processor 438 to obtain decoded data and control information sent by UE 120. Receive processor 438 may provide the decoded data to data sink 439 and the decoded control information to controller/processor 440.

Memory 442 may store data and program codes for BS 110 and memory 482 may store data and program codes for UE 120. Scheduler 444 may schedule UEs for data transmission on the downlink and/or uplink.

Figure 5:
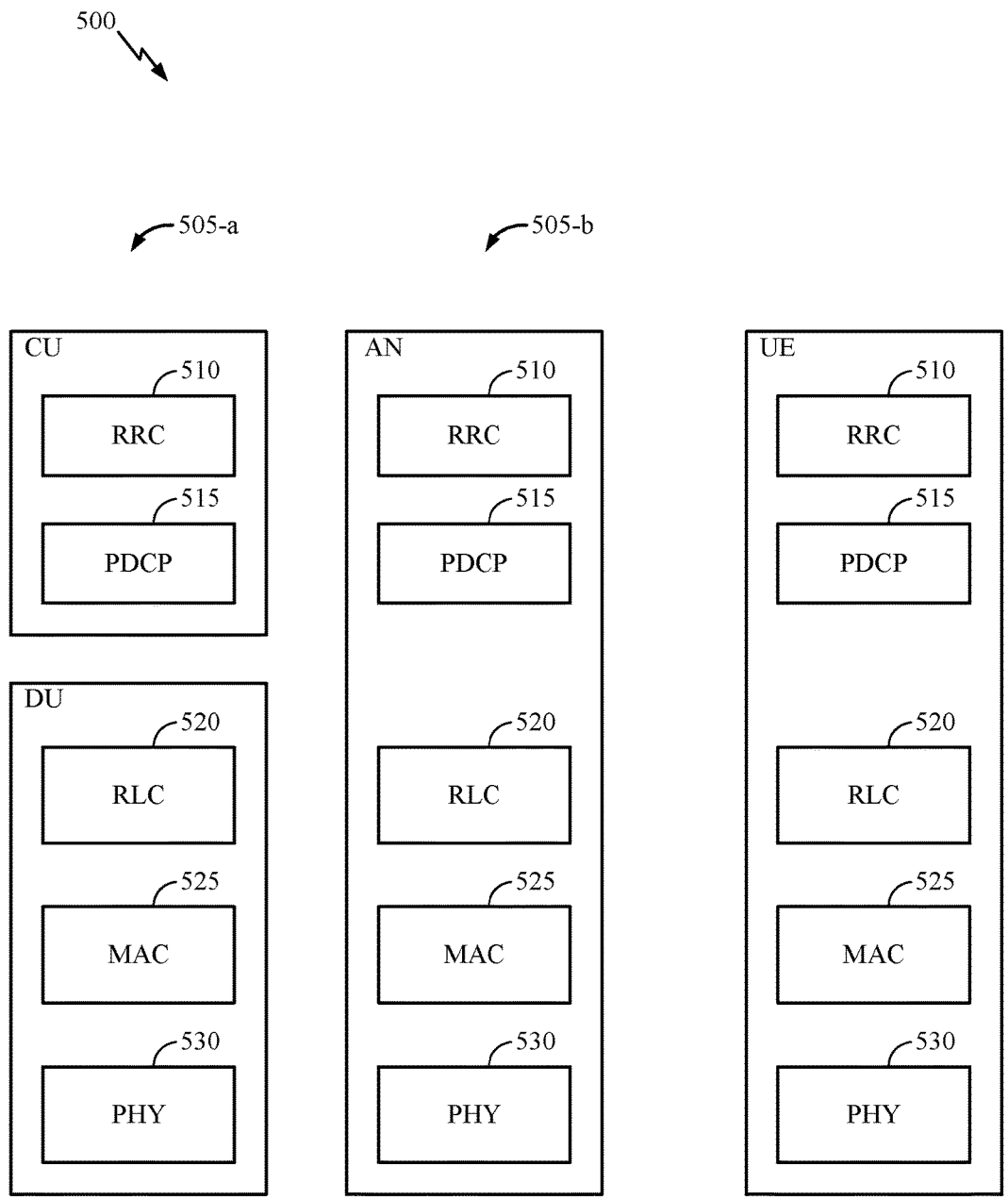
FIG. 5 is a diagram showing examples for implementing a communication protocol stack, in accordance with certain aspects of the present disclosure.

FIG. 5 illustrates a diagram 500 showing examples for implementing a communications protocol stack, according to aspects of the present disclosure. The illustrated communications protocol stacks may be implemented by devices operating in a in a 5G system (e.g., a system that supports uplink-based mobility). Diagram 500 illustrates a communications protocol stack including RRC layer 510, PDCP layer 515, RLC layer 520, MAC layer 525, and PHY layer 530. In an example, the layers of a protocol stack may be implemented as separate modules of software, portions of a processor or ASIC, portions of non-collocated devices connected by a communications link, or various combinations thereof. Collocated and non-collocated implementations may be used, for example, in a protocol stack for a network access device (e.g., ANs, CUs, and/or DUs) or a UE.

A first option 505-a shows a split implementation of a protocol stack, in which implementation of the protocol stack is split between a centralized network access device (e.g., ANC 202) and distributed network access device (e.g., DU 208). In the first option 505-a, RRC layer 510 and PDCP layer 515 may be implemented by the CU, and RLC layer 520, MAC layer 525, and PHY layer 530 may be implemented by the DU. In various examples, the CU and the DU may be collocated or non-collocated. The first option 505-*a* may be useful in a macro cell, micro cell, or pico cell deployment.

A second option 505-*b* shows a unified implementation of a protocol stack, in which the protocol stack is implemented in a single network access device (e.g., access node (AN), NR BS, a NR NB, a network node (NN), TRP, gNB, etc.). In the second option, RRC layer 510, PDCP layer 515, RLC layer 520, MAC layer 525, and PHY layer 530 may each be implemented by the AN. The second option 505-*b* may be useful in a femto cell deployment.

Regardless of whether a network access device implements part or all of a protocol stack, a UE may implement the entire protocol stack (e.g., RRC layer 510, PDCP layer 515, RLC layer 520, MAC layer 525, and PHY layer 530).

Figure 6:
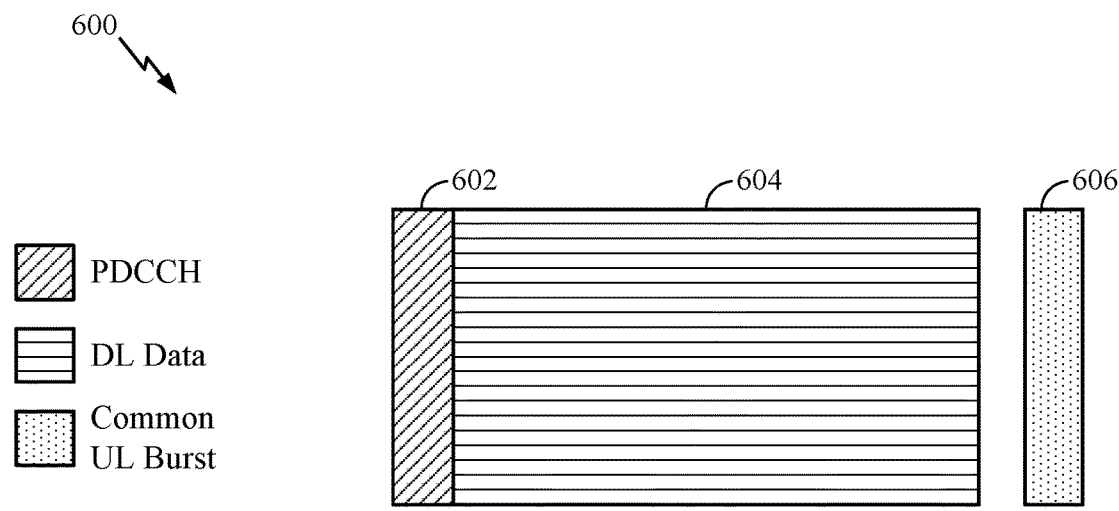
FIG. 6 illustrates an example of a downlink (DL)-centric subframe, in accordance with certain aspects of the present disclosure.

FIG. 6 is a diagram showing an example of a DL-centric subframe 600. The DL-centric subframe 600 may include control portion 602. Control portion 602 may exist in the initial or beginning portion of DL-centric subframe 600. Control portion 602 may include various scheduling information and/or control information corresponding to various portions of DL-centric subframe 600. In some configurations, control portion 602 may be a physical DL control channel (PDCCH), as shown in FIG. 6. DL-centric subframe 600 may also include DL data portion 604. DL data portion 604 may be referred to as the payload of DL-centric subframe 600. DL data portion 604 may include the communication resources utilized to communicate DL data from the scheduling entity (e.g., UE or BS) to the subordinate entity (e.g., UE). In some configurations, DL data portion 604 may be a physical DL shared channel (PDSCH).

DL-centric subframe 600 may also include common UL portion 606. Common UL portion 606 may be referred to as an UL burst, a common UL burst, and/or various other suitable terms. Common UL portion 606 may include feedback information corresponding to various other portions of DL-centric subframe 600. For example, common UL portion 606 may include feedback information corresponding to control portion 602. Non-limiting examples of feedback information may include an acknowledgment (ACK) signal, a negative acknowledgment (NACK) signal, a HARQ indicator, and/or various other suitable types of information. Common UL portion 606 may additionally or alternatively include information, such as information pertaining to random access channel (RACH) procedures, scheduling requests (SRs), and various other suitable types of information. As illustrated in FIG. 6, the end of DL data portion 604 may be separated in time from the beginning of common UL portion 606. This time separation may be referred to as a gap, a guard period, a guard interval, and/or various other suitable terms. This separation provides time for the switchover from DL communication (e.g., reception operation by the subordinate entity (e.g., UE)) to UL communication (e.g., transmission by the subordinate entity (e.g., UE)). The foregoing is merely one example of a DL-centric subframe and alternative structures having similar features may exist without necessarily deviating from the aspects described herein.

Figure 7:
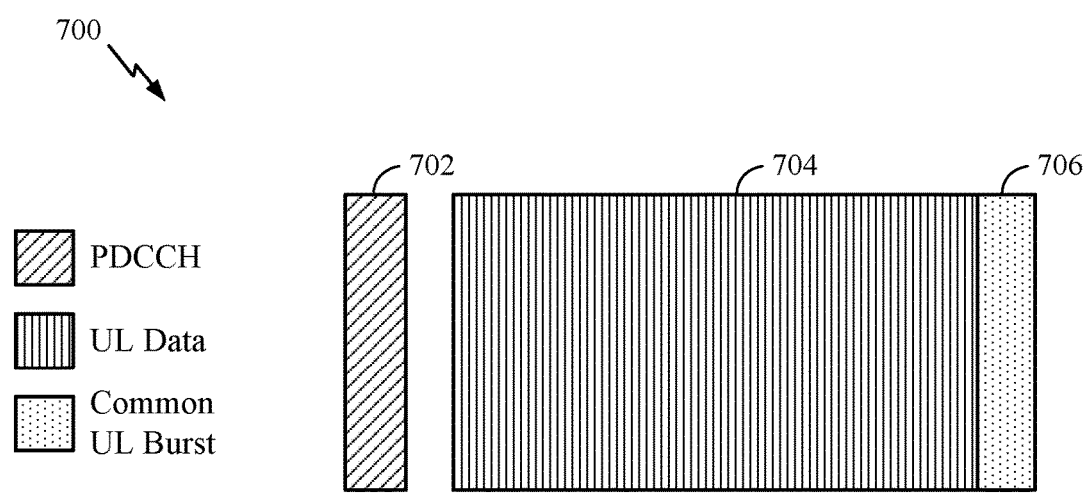
FIG. 7 illustrates an example of an uplink (UL)-centric subframe, in accordance with certain aspects of the present disclosure.

FIG. 7 is a diagram showing an example of an UL-centric subframe 700. UL-centric subframe 700 may include control portion 702. Control portion 702 may exist in the initial or beginning portion of UL-centric subframe 700. Control portion 702 in FIG. 7 may be similar to control portion 602 described above with reference to FIG. 6. UL-centric subframe 700 may also include UL data portion 704. UL data portion 704 may be referred to as the payload of UL-centric subframe 700. UL data portion 704 may refer to the communication resources utilized to communicate UL data from the subordinate entity (e.g., UE) to the scheduling entity (e.g., UE or BS). In some configurations, control portion 702 may be a PDCCH.

As illustrated in FIG. 7, the end of control portion 702 may be separated in time from the beginning of UL data portion 704. This time separation may be referred to as a gap, guard period, guard interval, and/or various other suitable terms. This separation provides time for the switchover from DL communication (e.g., reception operation by the scheduling entity) to UL communication (e.g., transmission by the scheduling entity). UL-centric subframe 700 may also include common UL portion 706. Common UL portion 706 in FIG. 7 may be similar to the common UL portion 606 described above with reference to FIG. 6. Common UL portion 706 may additionally or alternatively include information pertaining to channel quality indicator (CQI), sounding reference signals (SRSs), and various other suitable types of information. The foregoing is merely one example of an UL-centric subframe and alternative structures having similar features may exist without necessarily deviating from the aspects described herein.

In some circumstances, two or more subordinate entities (e.g., UEs) may communicate with each other using sidelink signals. Real-world applications of such sidelink communications may include public safety, proximity services, UE-to-network relaying, vehicle-to-vehicle (V2V) communications, Internet-of-Everything (IoE) communications, IoT communications, mission-critical mesh, and/or various other suitable applications. Generally, a sidelink signal may refer to a signal communicated from one subordinate entity (e.g., UE1) to another subordinate entity (e.g., UE2) without relaying that communication through the scheduling entity (e.g., UE or BS), even though the scheduling entity may be utilized for scheduling and/or control purposes. In some examples, the sidelink signals may be communicated using a licensed spectrum (unlike wireless local area networks (WLAN), which typically use an unlicensed spectrum).

A UE may operate in various radio resource configurations, including a configuration associated with transmitting pilots using a dedicated set of resources (e.g., a radio resource control (RRC) dedicated state, etc.) or a configuration associated with transmitting pilots using a common set of resources (e.g., an RRC common state, etc.). When operating in the RRC dedicated state, the UE may select a dedicated set of resources for transmitting a pilot signal to a network. When operating in the RRC common state, the UE may select a common set of resources for transmitting a pilot signal to the network. In either case, a pilot signal transmitted by the UE may be received by one or more network access devices, such as an AN, or a DU, or portions thereof. Each receiving network access device may be configured to receive and measure pilot signals transmitted on the common set of resources, and also receive and measure pilot signals transmitted on dedicated sets of resources allocated to the UEs for which the network access device is a member of a monitoring set of network access devices for the UE. One or more of the receiving network access devices, or a CU to which receiving network access device(s) transmit the measurements of the pilot signals, may use the measurements to identify serving cells for the UEs, or to initiate a change of serving cell for one or more of the UEs.

Example Error Correction Coding

Many communications systems use error-correcting codes. Specifically, error correcting codes compensate for the intrinsic unreliability of information transfer in these systems by introducing redundancy into the data stream. Low-density parity-check (LDPC) codes are a particular type of error correcting codes which use an iterative coding system. Gallager codes are an early example of "regular" LDPC codes. Regular LDPC codes are linear block code in which most of the elements of its parity check matrix H are '0'.

LDPC codes can be represented by bipartite graphs (often referred to as "Tanner graphs"), wherein a set of variable nodes corresponds to bits of a codeword (e.g., information bits or systematic bits), and a set of check nodes correspond to a set of parity-check constraints that define the code. Thus, the nodes of the graph are separated into two distinctive sets and with edges connecting nodes of two different types, variable and check. A regular graph or code is one for which all variable nodes have the same degree and all constraint nodes have the same degree. In this case, the code is a regular code. On the other hand, an irregular code has constraint nodes and/or variable nodes of differing degrees. For example, some variable nodes may be of degree 4, others of degree 3 and still others of degree 2.

"Lifting" enables LDPC codes to be implemented using parallel encoding and/or decoding implementations while also reducing the complexity typically associated with large LDPC codes. More specifically, lifting is a technique for generating a relatively large LDPC code from multiple copies of a smaller base code. For example, a lifted LDPC code may be generated by producing a number (Z) of parallel copies of the base graph and then interconnecting the parallel copies through permutations of edge clusters of each copy of the base graph. Thus, a larger graph can be obtained by a "copy and permute" operation where multiple copies are overlaid so that same-type vertices are in close proximity, but the overall graph consists of multiple disconnected subgraphs.

A lifted graph is created by copying a bipartite base graph (G), which may also be referred to as the protograph, a number of times, Z which may be referred to as the lifting, lifting size, or lifting size value. A variable node and a check node are considered "neighbors" if they are connected by an "edge" (i.e., the line connecting the variable node and the check node) in the graph. In addition, for each edge (e) of the bipartite base graph (G), a permutation is applied to the Z copies of edge (e) to interconnect the N copies of G. The permutation is generally an integer value k associated with the edge, which may be referred to as the lifting value. A bit sequence having a one-to-one association with the variable node sequence is a valid codeword if and only if, for each check node, the bits associated with all neighboring variable nodes sum to zero modulo two (i.e., they include an even number of 1's). The resulting LDPC code may be quasi-cyclic (QC) if the permutations (lifting values) used are cyclic.

Figures 8, 8A:
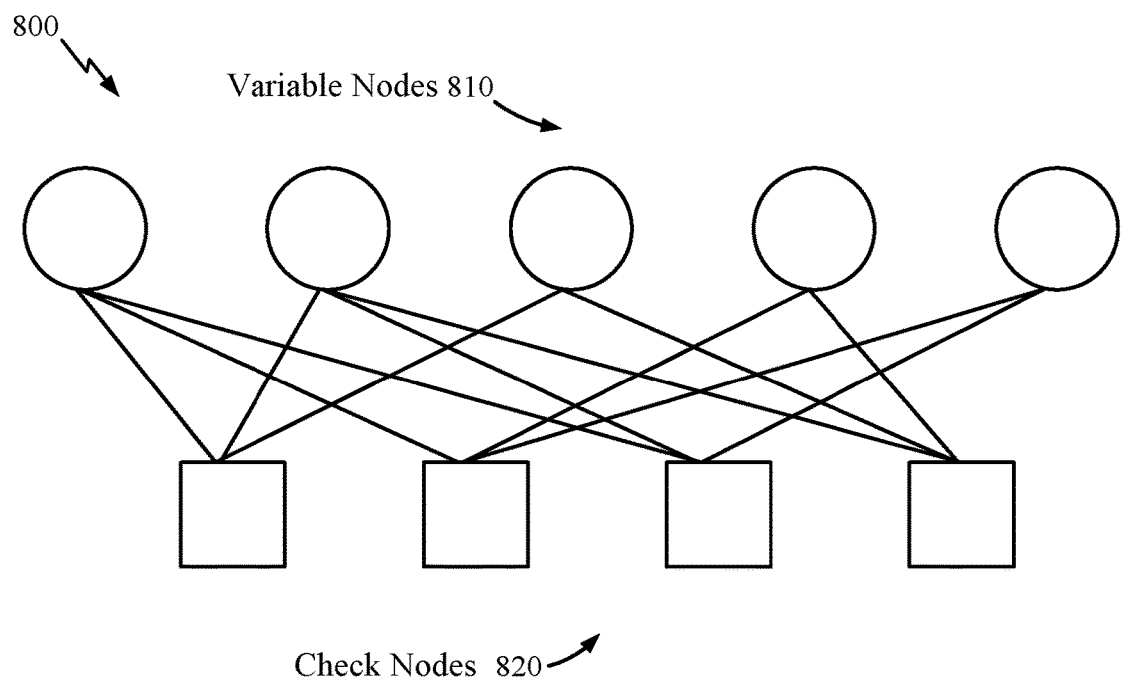
FIG. 8 is a graphical representation of an exemplary low-density parity-check (LDPC) code, in accordance with certain aspects of the present disclosure.
FIG. 8A is a matrix representation of the example LDPC code of FIG. 8, in accordance with certain aspects of the present disclosure.

FIGS. 8-8A show graphical and matrix representations, respectively, of an example LDPC code, in accordance with certain aspects of the present disclosure. For example, FIG. 8 shows a bipartite graph 800 representing the LDPC code. The bipartite graph 800 includes a set of 5 variable nodes 810 (represented by circles) connected to 4 check nodes 820 (represented by squares). Edges in the bipartite graph 800 connect variable nodes 810 to the check nodes 820 (represented by the lines connecting the variable nodes 810 to the check nodes 820). Thus, the bipartite graph 800 consists of $|V|=5$ variable nodes and $|C|=4$ check nodes, connected by $|E|=12$ edges.

The bipartite graph 800 may be represented by a simplified adjacency matrix, as shown in FIG. 8A. The matrix representation 800A includes a parity check matrix (PCM) H and a codeword vector x, where $x_1$-$x_5$ represent bits of the codeword x. H is used to determine if a received signal was normally decoded. H has C rows corresponding to j check nodes and V columns corresponding to i variable nodes (i.e., a demodulated symbol), where the rows represent the equations and the columns represents the bits of the codeword. In FIG. 8A, H has 4 rows and 5 columns corresponding to 4 check nodes and 5 variable nodes from the bipartite graph 800, respectively. If a j-th check node is connected to an i-th variable node by an edge (i.e., the two nodes are neighbors), then there is a "1" in the i-th column and in the j-th row of H. That is, the intersection of an i-th row and a j-th column contains a "1" where an edge joins the corresponding vertices and a "0" where there is no edge. The codeword vector x represents a valid codeword if and only if $H_x=0$ (e.g., if, for each constraint node, the bits neighboring the constraint (via their association with variable nodes) sum to 0 modulo 2 (i.e., they comprise an even number of ones). Thus, if the codeword is received correctly, then $H_x=0$ (mod 2). When the product of a coded received signal and H becomes "0", this signifies that no error has occurred.

The number of demodulated symbols or variable nodes is the LDPC code length. The number of non-zero elements in a row (column) is defined as the row (column) weight d(c)d(v). The degree of a node refers to the number of edges connected to that node. This feature is illustrated in the matrix H shown in FIG. 8A where the number of edges incident to a variable node 810 is equal to the number of 1's in the corresponding column and is called the variable node degree d(v). Similarly, the number of edges connected with a check node 820 is equal to the number of 1's in a corresponding row and is called the check node degree d(c).

Figure 9:
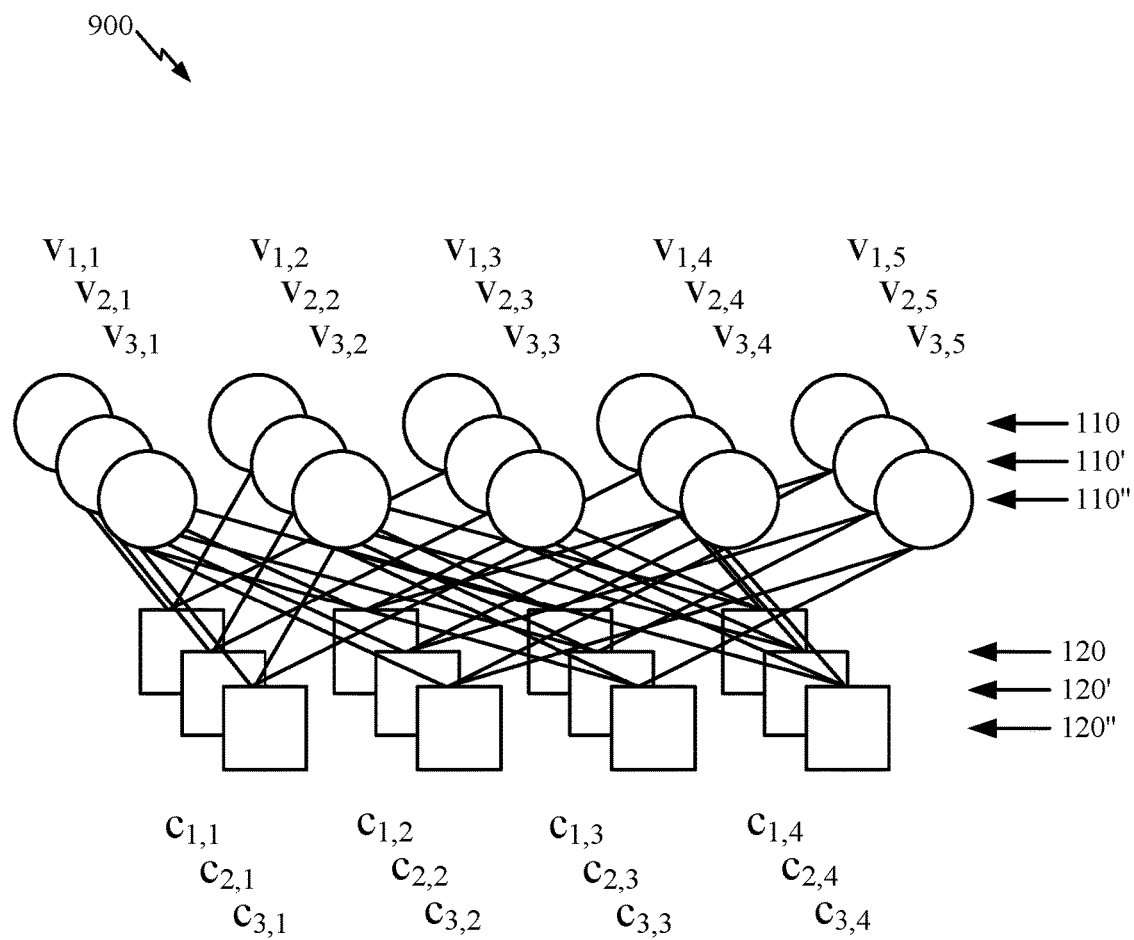
FIG. 9 is a graphical representation of liftings of the LDPC code of FIG. 8, in accordance with certain aspects of the present disclosure.

FIG. 9 is a bipartite graph 900 illustrating the liftings of three copies of the bipartite graph 800 of FIG. 8. Three copies may be interconnected by permuting like edges among the copies. If the permutations are restricted to cyclic permutations, then the resulting graph corresponds to a quasi-cyclic LDPC with lifting Z=3. The original graph from which three copies were made is referred to herein as the base graph. To derive graphs of different sizes from the base graph, a "copy and permute" operation can be applied to the base graph.

A corresponding PCM of the lifted graph can be constructed from the PCM of the base graph by replacing each entry in the base PCM with a Z×Z matrix. The "0" entries (those having no base edges) are replaced with the 0 matrix and the 1 entries (indicating a base edge) are replaced with a Z×Z permutation matrix. In the case of cyclic liftings, the permutations are cyclic permutations.

A cyclically lifted LDPC code can also be interpreted as a code over the ring of binary polynomials modulo $x^z+1$. In this interpretation, a binary polynomial, $(x)=b_0+b_1x+b_2x^2+\ldots+b_{z-1}x^{z-1}$ may be associated to each variable node in the base graph. The binary vector $(b_0, b_1, b_2, \ldots, b_{z-1})$ corresponds to the bits associated to Z corresponding variable nodes in the lifted graph, that is, Z copies of a single base variable node. A cyclic permutation by k (referred to as a lifting value associated to the edges in the graph) of the binary vector is achieved by multiplying the corresponding binary polynomial by $x^k$ where multiplication is taken modulo $x^z+1$. A degree d parity check in the base graph can be interpreted as a linear constraint on the neighboring binary polynomials $B_1(x), \ldots, B_d(x)$, written as $x^{k_1}B_1(x)+x^{k_2}B_2(x)+ \ldots +x^{k_d}B_d(x)=0x^{k_1}B_1(x)+x^{k_2}B_2(x)+ \ldots +x^{k_d}B_d(x)=0$, the values, $k_1, \ldots, k_d$ are the cyclic lifting values associated to the corresponding edges.

This resulting equation is equivalent to the Z parity checks in the cyclically lifted Tanner graph corresponding to the single associated parity check in the base graph. Thus, the parity check matrix for the lifted graph can be expressed using the matrix for the base graph in which 1 entries are replaced with monomials of the form $x^k$ and 0 entries are lifted as 0, but now the 0 is interpreted as the 0 binary polynomial modulo $x^z+1$. Such a matrix may be written by giving the value k in place of $x^k$. In this case the 0 polynomial is sometimes represented as "−1" and sometimes as another character in order to distinguish it from $x^0$.

Figure 10:
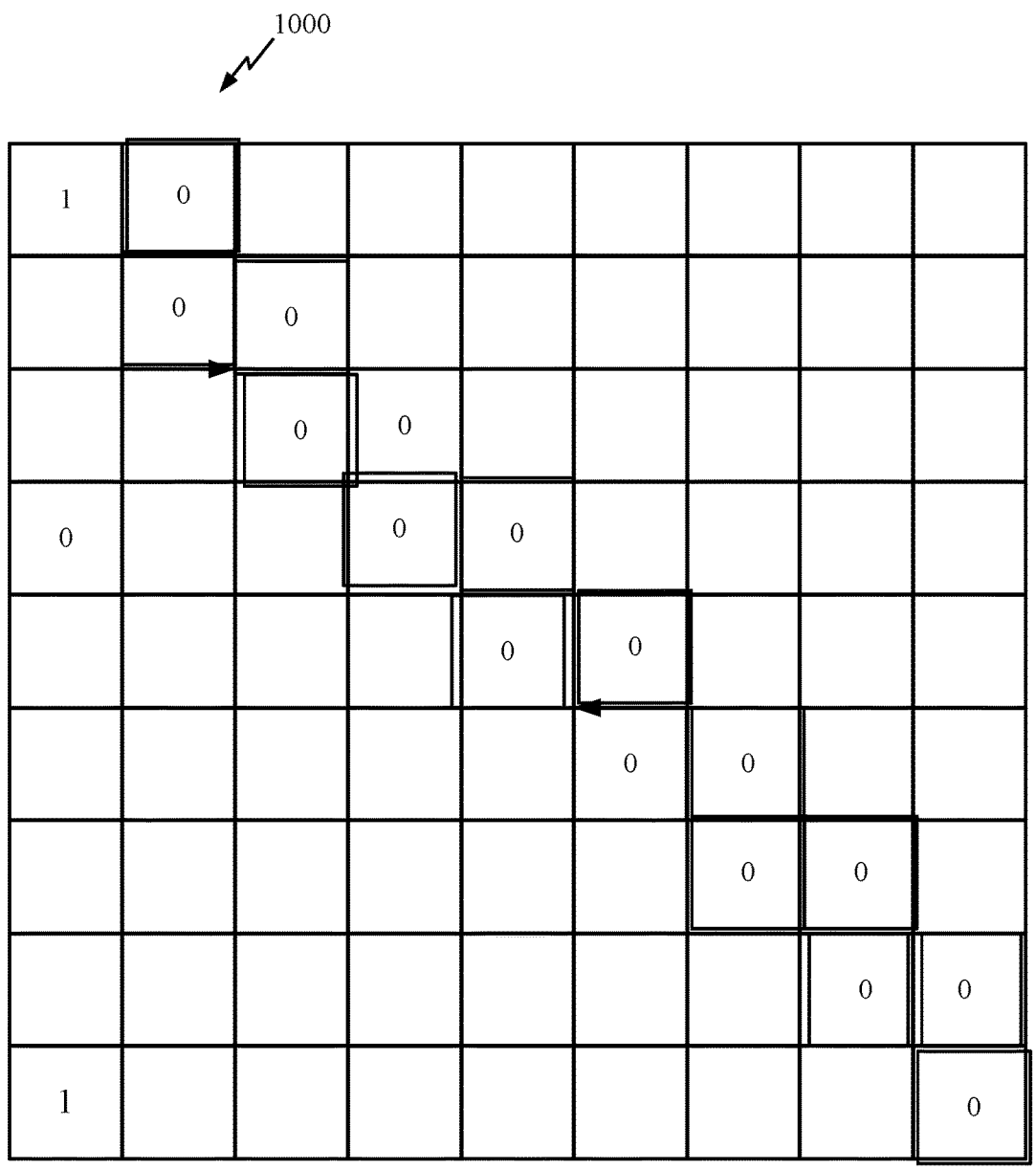
FIG. 10 is an integer representation of a matrix for a quasi-cyclic 802.11 LDPC code.

Typically, a square submatrix of the parity check matrix represents the parity bits of the code. The complementary columns correspond to information bits that, at the time of encoding, are set equal to the information bits to be encoded. The encoding may be achieved by solving for the variables in the aforementioned square submatrix in order to satisfy the parity check equations. The matrix H may be partitioned into two parts M and N where M is the square portion. Thus, encoding reduces to solving $M_c$=s=Nd where c and d comprise x. In the case of quasi-cyclic codes, or cyclically lifted codes, the above algebra can be interpreted as being over the ring of binary polynomials modulo $x^z+1$. In the case of the 802.11 LDPC codes, which are quasi-cyclic, the encoding submatrix M has an integer representation 1000 as shown in FIG. 10.

A received LDPC codeword can be decoded to produce a reconstructed version of the original codeword. In the absence of errors, or in the case of correctable errors, decoding can be used to recover the original data unit that was encoded. Redundant bits may be used by decoders to detect and correct bit errors. LDPC decoder(s) generally operate by iteratively performing local calculations and passing those results by exchanging messages within the bipartite graph 800, along the edges, and updating these messages by performing computations at the nodes based on the incoming messages. These steps may typically be repeated several times. For example, each variable node 810 in the graph 800 may initially be provided with a "soft bit" (e.g., representing the received bit of the code word) that indicates an estimate of the associated bit's value as determined by observations from the communications channel. Using these soft bits the LDPC decoders may update messages by iteratively reading them, or some portion thereof, from memory and writing an updated message, or some portion thereof, back to, memory. The update operations are typically based on the parity check constraints of the corresponding LDPC code. In implementations for lifted LDPC codes, messages on like edges are often processed in parallel.

LDPC codes designed for high-speed applications often use quasi-cyclic constructions with large lifting factors and relatively small base graphs to support high parallelism in encoding and decoding operations. LDPC codes with higher code rates (e.g., the ratio of the message length to the codeword length) tend to have relatively fewer parity checks. If the number of base parity checks is smaller than the degree of a variable node (e.g., the number of edges connected to a variable node), then, in the base graph, that variable node is connected to at least one of the base parity checks by two or more edges (e.g., the variable node may have a "double edge"). If the number of base parity checks is smaller than the degree of a variable node (e.g., the number of edges connected to a variable node), then, in the base graph, that variable node is connected to at least one of the base parity checks by two or more edges. Having a base variable node and a base check node connected by two or more edges is generally undesirable for parallel hardware implementation purposes. For example, such double edges may result in multiple concurrent read and write operations to the same memory locations, which in turn may create data coherency problems. A double edge in a base LDPC code may trigger parallel reading of the same soft bit value memory location twice during a single parallel parity check update. Thus, additional circuitry is typically needed to combine the soft bit values that are written back to memory, so as to properly incorporate both updates. Eliminating double edges in the LDPC code helps to avoid this extra complexity LDPC code designs based on cyclic lifting can be interpreted as codes over the ring of polynomials modulo may be binary polynomials modulo $x^z−1$, where Z is the lifting size (e.g., the size of the cycle in the quasi-cyclic code). Thus, encoding such codes can often be interpreted as an algebraic operation in this ring.

In the definition of standard irregular LDPC code ensembles (degree distributions) all edges in the Tanner graph representation may be statistically interchangeable. In other words, there exists a single statistical equivalence class of edges. For multi-edge LDPC codes, multiple equivalence classes of edges may be possible. While in the standard irregular LDPC ensemble definition, nodes in the graph (both variable and constraint) are specified by their degree, i.e., the number of edges they are connected to, in the multi-edge type setting an edge degree is a vector; it specifies the number of edges connected to the node from each edge equivalence class (type) independently. A multi-edge type ensemble is comprised of a finite number of edge types. The degree type of a constraint node is a vector of (non-negative) integers; the i-th entry of this vector records the number of sockets of the i-th type connected to such a node. This vector may be referred to as an edge degree. The degree type of a variable node has two parts although it can be viewed as a vector of (non-negative) integers. The first part relates to the received distribution and will be termed the received degree and the second part specifies the edge degree. The edge degree plays the same role as for constraint nodes. Edges are typed as they pair sockets of the same type. The constraint, that sockets must pair with sockets of like type, characterizes the multi-edge type concept. In a multi-edge type description, different node types can have different received distributions (e.g., the associated bits may go through different channels).

Puncturing is performed by removing bits from a codeword to generate a shorter codeword. Thus, punctured variable nodes correspond to codeword bits that are not actually transmitted. Puncturing a variable node in an LDPC code creates a shortened code (e.g., due to the removal of a bit), while also effectively removing a check node. Specifically, for a matrix representation of an LDPC code, including bits to be punctured, where the variable node to be punctured has a degree of one (e.g., by row combining), puncturing the variable node removes the associated bit from the code and effectively removes its single neighboring check node from the graph. As a result, the number of check nodes in the graph is reduced by one.

Figure 11:
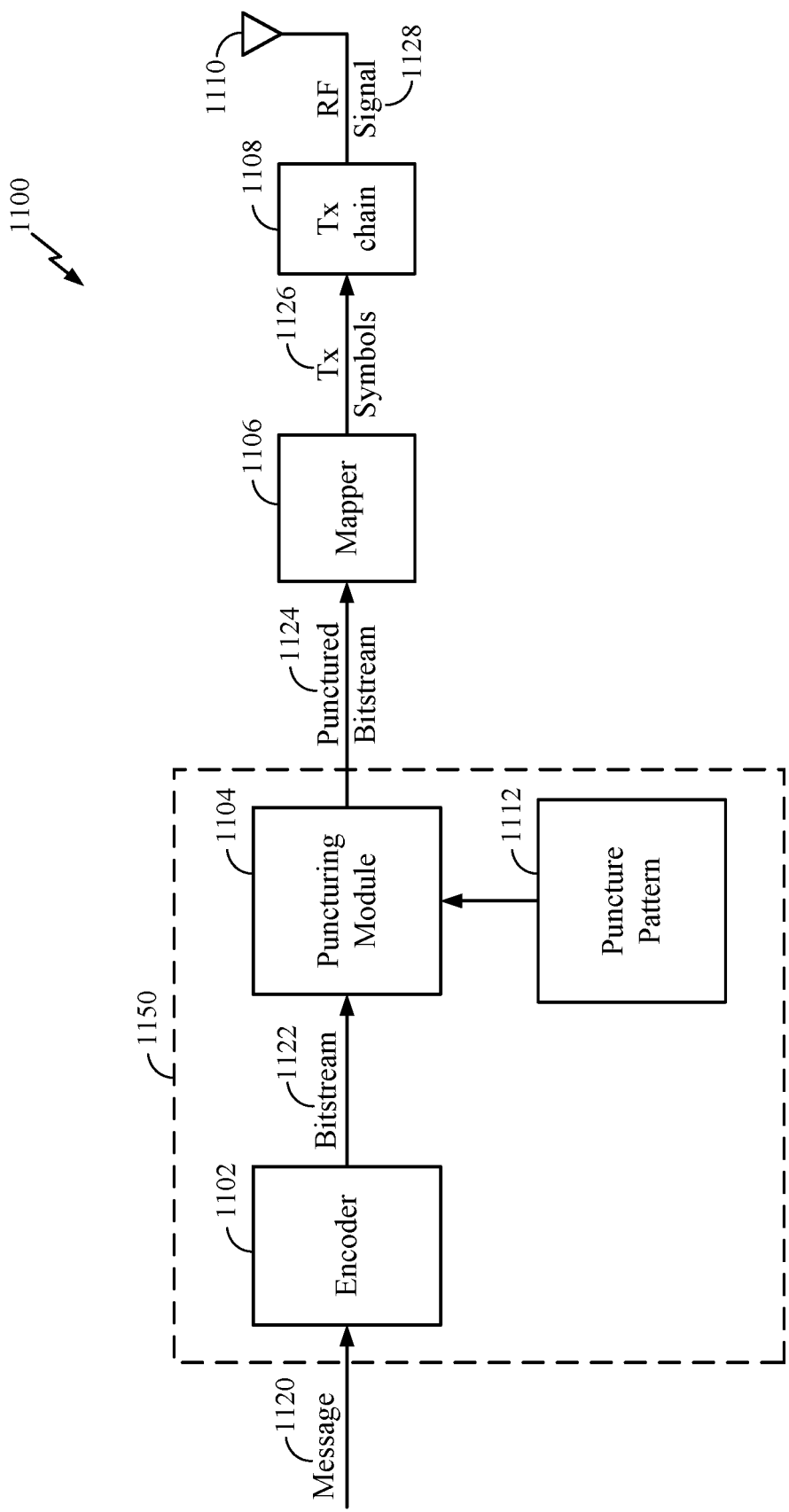
FIG. 11 is a simplified block diagram illustrating an example encoder, in accordance with certain aspects of the present disclosure.

FIG. 11 is a simplified block diagram illustrating an encoder, in accordance with certain aspects of the present disclosure. FIG. 11 is a simplified block diagram 1100 illustrating a portion of a radio frequency (RF) modem 1150 that may be configured to provide a signal including an encoded message for wireless transmission. In one example, a convolutional encoder 1102 in a BS 110 (or a UE 120 on the reverse path) receives a message 1120 for transmission. The message 1120 may contain data and/or encoded voice or other content directed to the receiving device. The encoder 1102 encodes the message using a suitable modulation and coding scheme (MCS), typically selected based on a configuration defined by the BS 110 or another network entity. An encoded bitstream 1122 produced by the encoder 1102 may then be selectively punctured by a puncturing module 1104, which may be a separate device or component, or which may be integrated with the encoder 1102. The puncturing module 1104 may determine that the bitstream should be punctured prior to transmission, or transmitted without puncturing. The decision to puncture the bitstream 1122 is typically made based on network conditions, network configuration, RAN defined preferences and/or for other reasons. The bitstream 1122 may be punctured according to a puncture pattern 1112 and used to encode the message 1120. The puncturing module 1104 provides an output 1124 to a mapper 1106 that generates a sequence of Tx symbols 1126 that are modulated, amplified, and otherwise processed by Tx chain 1108 to produce an RF signal 1128 for transmission through antenna 1110.

The output 1124 of the puncturing module 1104 may be the unpunctured bitstream 1122 or a punctured version of the bitstream 1122, according to whether the modem portion 1150 is configured to puncture the bitstream 1122. In one example, parity and/or other error correction bits may be punctured in the output 1124 of the encoder 1102 in order to transmit the message 1120 within a limited bandwidth of the RF channel. In another example, the bitstream may be punctured to reduce the power needed to transmit the message 1120, to avoid interference, or for other network-related reasons. These punctured codeword bits are not transmitted.

The decoders and decoding algorithms used to decode LDPC codewords operate by exchanging messages within the graph along the edges and updating these messages by performing computations at the nodes based on the incoming messages. Each variable node in the graph is initially provided with a soft bit, termed a received value, that indicates an estimate of the associated bit's value as determined by observations from, for example, the communications channel. Ideally, the estimates for separate bits are statistically independent. This ideal may be violated in practice. A received word is comprised of a collection of received values.

Figure 12:
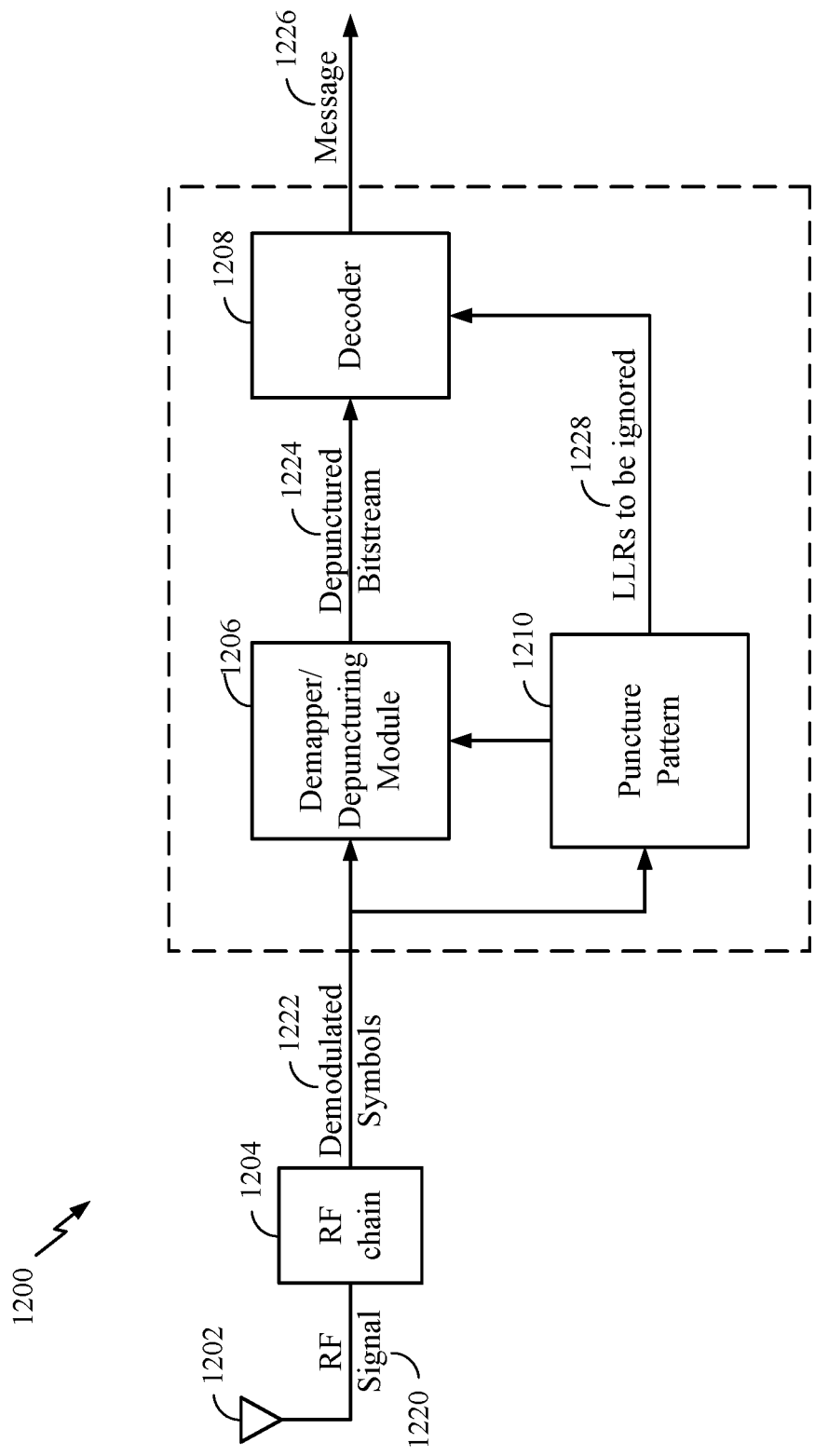
FIG. 12 is a simplified block diagram illustrating an example decoder, in accordance with certain aspects of the present disclosure.

FIG. 12 is a simplified block diagram illustrating a decoder, in accordance with certain aspects of the present disclosure. FIG. 12 is a simplified schematic 1200 illustrating a portion of a RF modem 1250 that may be configured to receive and decode a wirelessly transmitted signal including a punctured encoded message. The punctured codeword bits may be treated as erased. For example, the LLRs of the punctured nodes may be set to "0" at initialization. In various examples, the modem 1250 receiving the signal may reside at the UE, at the BS, or at any other suitable apparatus or means for carrying out the described functions. An antenna 1202 provides an RF signal 1220 to a UE. An RF chain 1204 processes and demodulates the RF signal 1220 and may provide a sequence of symbols (a punctured bitstream) 1222 to a demapper 1206, which produces a bitstream 1224 representative of the encoded message.

The demapper 1206 may provide a depunctured bitstream 1224. In one example, the demapper 1206 may include a depuncturing module that can be configured to insert null values at locations in the bitstream at which punctured bits were deleted by the transmitter. The depuncturing module may be used when the puncture pattern 1210 used to produce the punctured bitstream at the transmitter is known. The puncture pattern 1210 can be used to identify LLRs 1228 that may be ignored during decoding of the bitstream 1224 by the convolutional decoder 1208. The LLRs may be associated with a set of depunctured bit locations in the bitstream 1224. Accordingly, the decoder 1208 may produce the decoded message 1226 with reduced processing overhead by ignoring the identified LLRs 1228. The LDPC decoder may include a plurality of processing elements to perform the parity check or variable node operations in parallel. For example, when processing a codeword with lifting size Z, the LDPC decoder may utilize a number (Z) of processing elements to perform parity check operations on all Z edges of a lifted graph, concurrently.

Processing efficiency of a decoder 1208 may be improved by configuring the decoder 1208 to ignore LLRs 1228 that correspond to punctured bits in a message transmitted in a punctured bitstream 1222. The punctured bitstream 1222 may have been punctured according to a puncturing scheme that defines certain bits to be removed from an encoded message. In one example, certain parity or other error-correction bits may be removed. A puncturing pattern may be expressed in a puncturing matrix or table that identifies the location of bits to be punctured in each message. A puncturing scheme may be selected to reduce processing overhead used to decode the message 1226 while maintaining compliance with data rates on the communication channel and/or with transmission power limitations set by the network. A resultant punctured bitstream typically exhibits the error-correcting characteristics of a high rate error-correction code, but with less redundancy. Accordingly, puncturing may be effectively employed to reduce processing overhead at the decoder 1208 in the receiver when channel conditions produce a relatively high signal to noise ratio (SNR).

A convolutional decoder 1208 may be used to decode m-bit information strings from a bitstream that has been encoded using a convolutional code. The decoder 1208 may comprise a Viterbi decoder, an algebraic decoder, or another suitable decoder. In one example, a Viterbi decoder employs the well-known Viterbi algorithm to find the most likely sequence of signaling states (the Viterbi path) that corresponds to a received bitstream 1224. The bitstream 1224 may be decoded based on a statistical analysis of LLRs calculated for the bitstream 1224. In one example, a Viterbi decoder may compare and select the correct Viterbi path that defines a sequence of signaling states using a likelihood ratio test to generate LLRs from the bitstream 1224. Likelihood ratios can be used to statistically compare the fit of a plurality of candidate Viterbi paths using a likelihood ratio test that compares the logarithm of a likelihood ratio for each candidate Viterbi path (i.e. the LLR) to determine which path is more likely to account for the sequence of symbols that produced the bitstream 1224.

At the receiver, the same decoder used for decoding non-punctured bitstreams can typically be used for decoding punctured bitstreams, regardless of how many bits have been punctured. In conventional receivers, the LLR information is typically de-punctured before decoding is attempted by filling LLRs for punctured states or positions (de-punctured LLRs) with zeros. A decoder may disregard de-punctured LLRs that effectively carry no information.

Example Efficient Lifted LDPC Code Generation for Multiple Liftings

Certain systems (e.g., 802.11n, 802.11ad, WiMAX, ATSC, etc.) may use a multi-edge type LDPC code structure. Multi-edge type LDPC codes may have advantages over the standard irregular LDPC codes. For example, the multi-edge type LDPC code structure may provide more degrees of freedom than the standard irregular LDPC codes, which can be exploited to design codes with excellent performance, low encoding/decoding complexity, and/or other desirable properties. Multi-edge type constructions can introduce high-degree punctured variable nodes into the code structure so that the gap-to-capacity can be reduced with bounded node degrees.

Multi-edge type LDPC codes may be protograph based LDPC codes obtained from a base parity-check matrix (PCM). As described above, the PCM correspond to graphical representations of an LDPC code. The base PCM defines the base structure and reflects the edge-type structure defining the code. The base PCM may be lifted, for example, using circulant matrices to obtain the final PCM. Use of circulant matrices may result in a code that is quasi-cyclic. The circulant matrices can be selected to be cyclic shifts of the identity matrix of the size of the lift Z. Such codes are also known as matched-lifted codes.

The final PCM can be represented by replacing the non-zero entries in the base PCM by integers k in the range 0 to Z−1. The integer represents the size of the cyclic shift (by that integer) associated to the lifted bundle of edges in the lifted code structure. As discussed above, these integers k may be referred to as lifting values.

To obtain LDPC codes for a range of blocklengths, different values of Z (i.e., lifting size values) can be applied to the same base graph (or base PCM), for example, a particular lifting size value can be selected to achieve a target blocklength from a base code. A different set of lifting values k can be used for each different value of Z.

For a large number of blocklengths (e.g., many different values of Z), it may be desirable to be able to generate multiple different liftings, but by storing fewer bits then it would take to specify all of the different lifted codes. One approach to efficiently generated multiple codes is to determine the lifting values $k_x$ for smaller lifting sizes $Z_x$ (e.g., smaller than a maximum lifting value $Z_{max}$ of a range of lifting values $Z_{min}$–$Z_{max}$) based on the lifting values $k_{max}$ for the $Z_{max}$. For example, the lifting values $k_x$ for the smaller $Z_x$ can be determined by a modulo operation on $Z_x$ by the lifting values $k_{max}$ for the largest $Z_{max}$. For example, the lifting values $k_x$ for the smaller $Z_x$ can be determined by the operation $k_{max}$ modulo $Z_x$.

Decoding LDPC codes to find the original message involves passing probability messages around the graph of an LDCP code. If the graph contains no loops then the decoding is known to be optimal and proceeds very quickly. Unfortunately, many LDPC codes have loops in their graphs. As a result, the LDCP decoding algorithm iterates repeatedly until it is told to stop or it converges to a solution. In a short loop of a the graph the effect of the value of an incorrect bit will propagate back around the loop during an iteration, potentially reinforcing the incorrect value and resisting efforts of the LDCP algorithm to correct it. This effect is, however, generally more diluted with longer loops, and does not affect the decoder's performance as much. Therefore, due to the nature of the iterative decoders whose performance degrades in the presence of small loops, it may be desirable to design (obtain/determine/generate) LDPC codes so that the decoding graph has few small loops. A loop (or cycle) is defined as a closed path with no repeated nodes. This implies it has an event length.

While LDPC codes for multiple different liftings can be obtained (generated/determined) from only the stored liftings values $k_{max}$ for the $Z_{max}$, the multiple different liftings may not all have the desired loop properties. Liftings k can be chosen to achieve desirable loop properties in the graph. If the set of Z smaller than Zmax is fairly dense, then it may not be possible to choose the liftings values $k_{max}$ for the $Z_{max}$ so that all the modulo-constructed graphs (derived from the liftings values $k_{max}$) will also have few small loops. At least some of the values will provide liftings leading to degradation in decoding performance.

Therefore, techniques for generating LDPC codes for multiple lifting sizes Z, for a range of blocklengths, that all have desired loop properties (e.g., few, or no, small loops in the decoding graph) are desirable.

Accordingly, techniques for efficiently generating multiple lifted LDPC codes for a range of blocklengths and having high performance are provided herein. That is, techniques for efficiently generating LDPC codes for multiple Z that all have few small loops.

Figure 13:
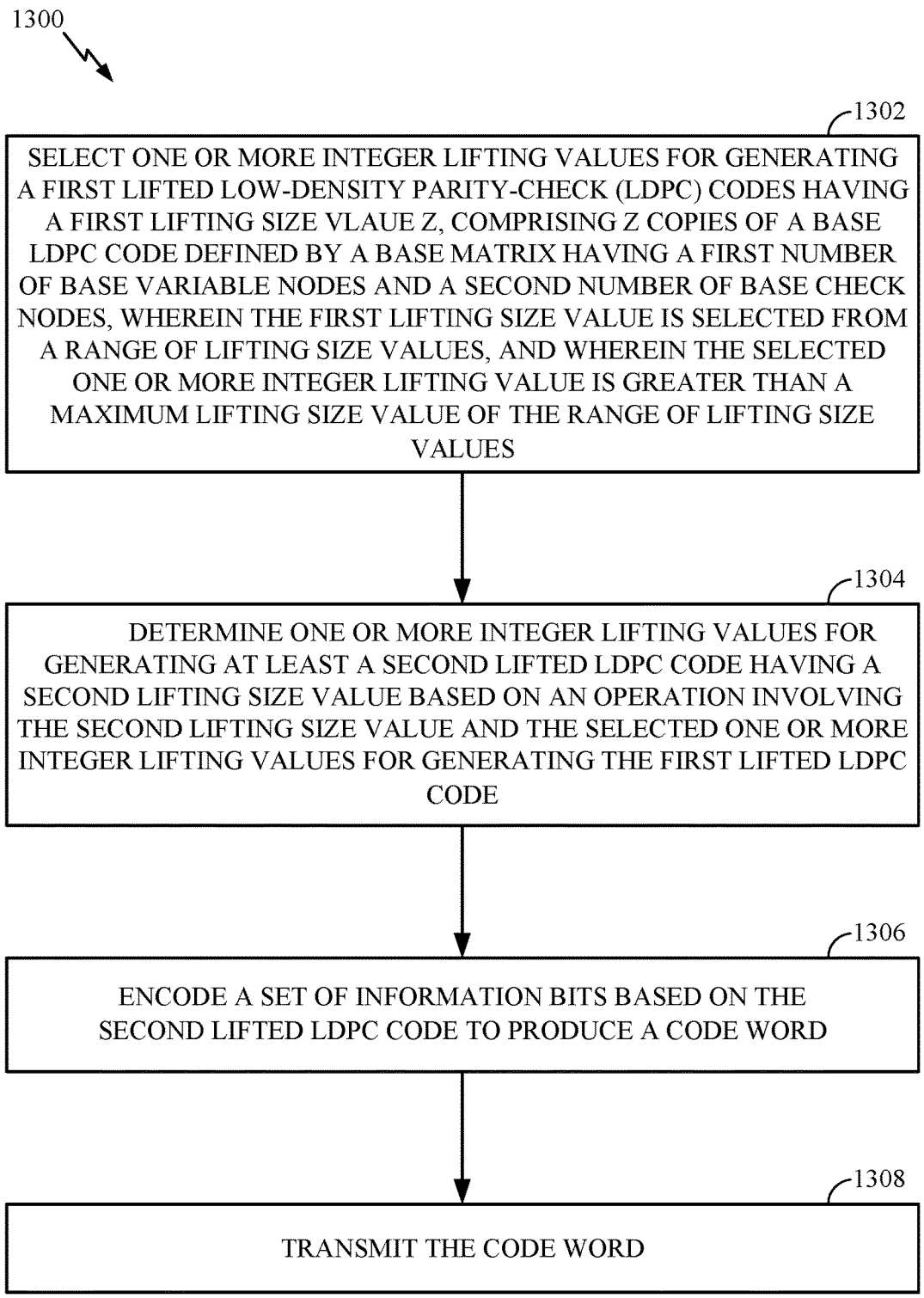
FIG. 13 is a flow diagram illustrating example operations for encoding information based on enhanced puncturing and LDPC code structure for wireless communications by a transmitting device, in accordance with certain aspects of the present disclosure.

FIG. 13 illustrates example operations 1300 for wireless communication, in accordance with certain aspects of the present disclosure. Operations 1300 may be performed, for example, by a transmitting device (e.g., UE 120 or BS 110). Operations 1300 may begin, at 1302, by selecting one or more integer lifting values (e.g., a set integer lift values associated with a loop or closed path in the base graph of the LDPC code) for generating a first lifted LDPC code having a first lifting size value Z, comprising Z copies of a base LDPC code defined by a base matrix having a first number of base variable nodes and a second number of base check nodes, wherein the first lifting size value is selected from a range of lifting size values, and wherein the selected one or more integer lifting values is greater than a maximum lifting size value of the range of lifting size values.

At 1304, the transmitting device determines one or more integer lifting values for generating a second lifted LDPC code having a second lifting size value based on an operation (e.g., a modulo operation) involving the second lifting size value (e.g., the divisor) and selected the one or more integer lifting values (e.g., the dividend) for generating the first lifted LDPC code.

At 1306, the transmitting device encodes a set of information bits based on the second lifted LDPC code to produce a code word. At 1308, the transmitting device transmits the code word.

According to certain aspects, the modulo operations discussed above may be used to generate liftings for a given Z. In aspects, the large integer lifting value k selected for the operation may be much larger than $Z_{max}$. If the set (e.g., range) of desired Z values (and blocklengths) is coprime, then setting k equal to the product of the Z may allow all liftings to be set independently (e.g., using a remainder theorem). However, this may result in no compression (e.g., may be inefficient). By choosing a large value for k (e.g., much larger than $Z_{max}$), values for edges can be selected so that all desired modulo-constructed lifted graphs have desired loop properties (e.g., a few, or no, small loops).

Figure 14:
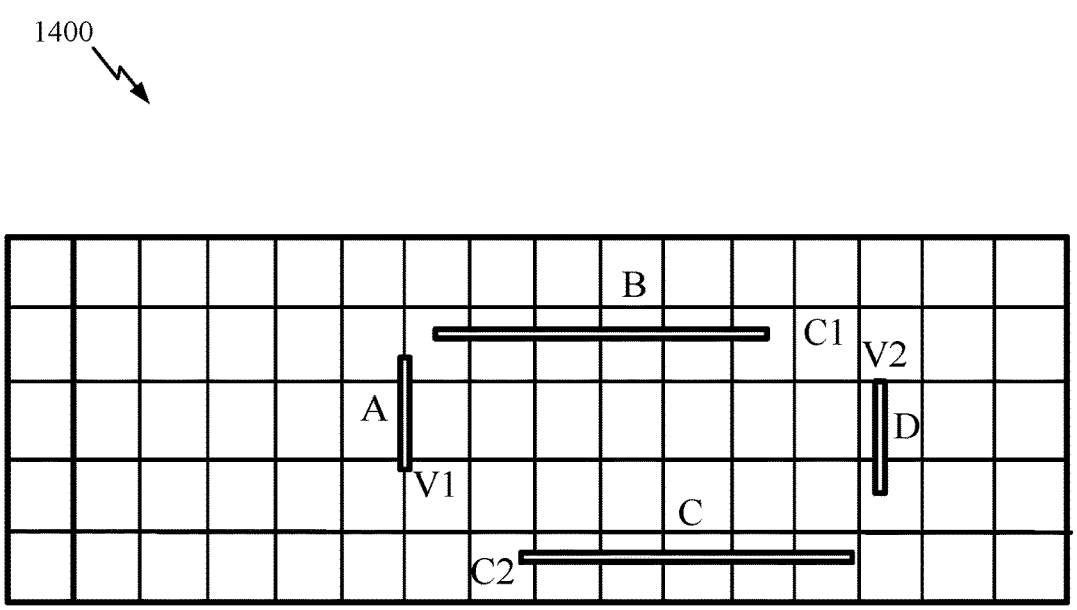
FIG. 14 is a representation of an example parity check matrix (PCM) for an LDPC code structure, in accordance with certain aspects of the present disclosure.

According to certain aspects, lifted LDPC codes may be considered as being lifted over the (e.g., infinite) additive group of the integers. For example, each edge in the graph may be associated with a non-negative integer (e.g., represented by "a", "b", "c", "d", as shown in FIG. 14). In general, loops in the lifted graph correspond to and project down to loops in the base graph 1400. As shown in FIG. 14, a loop of four edges (V1, C1, V2, C2, V1) is present in the base graph for an example lifted LDPC code. In a matched lifting the V-C (variable nodes and a second number of base check nodes) edges are lifted with group elements a, b, c, d (e.g., a set of integers) as shown in FIG. 14. The net lift in the above loop can be given by a−b+c−d. As long as the net lift is not equal to the identity in the lifting group, then the lifted group will not have the corresponding loop. In one example, in the cyclic shift by 16 case a, b, c, d=5, 6, 8, 11, respectively. In this example, the net cyclic shift in traversing the loop is 5−6+8−11=−3, 13 modulo 16. Since this is not 0 modulo 16 the loop is not present in the 16-lifted code (e.g., using the addition of the integers and the postponed taking the modulo-16 value until the completion of the loop because the modulo operation distributes across integer addition and subtraction).

According to certain aspects, integer values may be selected for the edges a, b, c, d such that a—b+c−d is non-zero and, therefore, not 0 modulo Z for a set of possible Z. This may ensure that with the selected a, b, c, d set of integers, for a desired Z, none of the modulo-constructed graphs will have the loop.

In one example, for a range of desired lifts with values Z=[16, 256], then in the $Z_{max}$ modulo lifting operation, the PCM can be designed for $Z_{max}$=256 and denoted by $H_{256}$. To obtain the PCM for any other $Z_x$=[16, 255], the entries of $H_{256}$ are taken modulo $Z_x$. In FIG. 14, the entries for a given $Z_x$ can be taken: a mod $Z_x$, b mod $Z_x$, c mod $Z_x$, and d mod $Z_x$. According to certain aspects, a, b, c, d may be chosen such that the sum a−b+c−d modulo Z is not zero. The entries may be taken from a much larger range of integers than Z=256. In other words, the entries of the PCM can be very large integers (e.g., as large as $2^{20}$). Thus, for a small number of loops in the basegraph, it would be possible to choose the lifting integers such that their modulo sum is non-zero for all of the desired range of Z. In one example, the sum of the selected entries (e.g., set of integer lift values) can be a prime number greater than the $Z_{max}$ (e.g., $Z_{max}$=256) since the modulo with respect to any Z=[16, 256], the modulo sum along the loops would not yield zero, thereby, avoiding small loops in the lifted PCM and achieving high performance.

The description complexity per edge may be increased relative to the $Z_{max}$ approach (e.g. by 12 bits), but can still result in significant compression over having independent values for each desired $Z_x$. Thus, high performing matched-lifted LDPC codes can be obtained with reasonably low description complexity.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

In some cases, rather than actually transmitting a frame, a device may have an interface to output a frame for transmission. For example, a processor may output a frame, via a bus interface, to an RF front end for transmission. Similarly, rather than actually receiving a frame, a device may have an interface to obtain a frame received from another device. For example, a processor may obtain (or receive) a frame, via a bus interface, from an RF front end for transmission.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a wireless node (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein.

Further, it should be appreciated that modules and/or other appropriate means for performing the methods and techniques described herein can be downloaded and/or otherwise obtained by a wireless node and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a wireless node and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:
1. A method for wireless communications, comprising:
  storing a first plurality of integer lifting values, wherein:
    each integer lifting value of the first plurality of integer lifting values is associated with an entry of a base matrix of a low-density parity-check (LDPC) code, and
    each integer lifting value of the first plurality integer lifting values is greater than a largest lifting size value of a plurality of lifting size values associated with the base matrix;
  generating a lifted matrix of a lifted LDPC code from the base matrix, wherein generating the lifted matrix comprises:
    selecting a lifting size value from the plurality of lifting size values; and
    determining a second plurality of integer lifting values, wherein:
      each integer lifting value of the second plurality of integer lifting values is associated with an entry in the lifted matrix, and
      each integer lifting value of the second plurality of integer lifting values is determined based on an operation involving the selected lifting size value and an integer lifting value of the first plurality of integer lifting values;
  encoding a set of information bits based on the lifted matrix to produce a code word; and
  transmitting the code word.

2. The method of claim 1, wherein:
the operation comprises a modulo operation, and
the selected lifting size value is a divisor in the operation and the integer lifting value of the first plurality of integer lifting values is a dividend in the operation.

3. The method of claim 1, wherein the plurality of lifting size values corresponds to a range of blocklengths associated with the base matrix.

4. The method of claim 3, wherein the lifting size value is selected to achieve a target blocklength of the range of blocklengths.

5. The method of claim 1, wherein:
the first plurality of integer lifting values are associated with a closed loop in the base matrix, and
the first plurality of integer lifting values have a non-zero modulo sum for the closed loop.

6. An apparatus for wireless communications, comprising:
means for storing a first plurality of integer lifting values, wherein:
each integer lifting value of the first plurality of integer lifting values is associated with an entry of a base matrix of a low-density parity-check (LDPC) code, and
each integer lifting value of the first plurality integer lifting values is greater than a largest lifting size value of a plurality of lifting size values associated with the base matrix;
means for generating a lifted matrix of a lifted LDPC code from the base matrix, wherein generating the lifted matrix comprises:
selecting a lifting size value from the plurality of lifting size values; and
determining a second plurality of integer lifting values, wherein:
each integer lifting value of the second plurality of integer lifting values is associated with an entry in the lifted matrix, and
each integer lifting value of the second plurality of integer lifting values is determined based on an operation involving the selected lifting size value and an integer lifting value of the first plurality of integer lifting values;
means for encoding a set of information bits based on the lifted matrix to produce a code word; and
means for transmitting the code word.

7. The apparatus of claim 6, wherein:
the operation comprises a modulo operation, and
the selected lifting size value is a divisor in the operation and the integer lifting value of the first plurality of integer lifting values is a dividend in the operation.

8. The apparatus of claim 6, wherein the plurality of lifting size values corresponds to a range of blocklengths associated with the base matrix.

9. The apparatus of claim 8, wherein the lifting size value is selected to achieve a target blocklength of the range of blocklengths.

10. The apparatus of claim 6, wherein:
the first plurality of integer lifting values are associated with a closed loop in the base matrix, and
the first plurality of integer lifting values have a non-zero modulo sum for the closed loop.

11. An apparatus for wireless communications, comprising:
at least one processor coupled with a memory and configured to:
store a first plurality of integer lifting values, wherein:
each integer lifting value of the first plurality of integer lifting values is associated with an entry of a base matrix of a low-density parity-check (LDPC) code, and
each integer lifting value of the first plurality integer lifting values is greater than a largest lifting size value of a plurality of lifting size values associated with the base matrix;
generate a lifted matrix of a lifted LDPC code from the base matrix, wherein generating the lifted matrix comprises:
selecting a lifting size value from the plurality of lifting size values; and
determining a second plurality of integer lifting values, wherein:
each integer lifting value of the second plurality of integer lifting values is associated with an entry in the lifted matrix, and
each integer lifting value of the second plurality of integer lifting values is determined based on an operation involving the selected lifting size value and an integer lifting value of the first plurality of integer lifting values;
encode a set of information bits based on the lifted matrix to produce a code word; and
a transmitter configured to transmit the code word.

12. The apparatus of claim 11, wherein:
the operation comprises a modulo operation, and
the selected lifting size value is a divisor in the operation and the integer lifting value of the first plurality of integer lifting values is a dividend in the operation.

13. The apparatus of claim 11, wherein the plurality of lifting size values corresponds to a range of blocklengths associated with the base matrix.

14. The apparatus of claim 13, wherein the lifting size value is selected to achieve a target blocklength of the range of blocklengths.

15. The apparatus of claim 11, wherein:
the first plurality of integer lifting values are associated with a closed loop in the base matrix, and
the first plurality of integer lifting values have a non-zero modulo sum for the closed loop.

16. A non-transitory computer-readable medium having computer executable code stored thereon for wireless communications, comprising:
code for storing a first plurality of integer lifting values, wherein:
each integer lifting value of the first plurality of integer lifting values is associated with an entry of a base matrix of a low-density parity-check (LDPC) code, and
each integer lifting value of the first plurality integer lifting values is greater than a largest lifting size value of a plurality of lifting size values associated with the base matrix;
code for generating a lifted matrix of a lifted LDPC code from the base matrix, wherein generating the lifted matrix comprises:
selecting a lifting size value from the plurality of lifting size values; and
determining a second plurality of integer lifting values, wherein:
each integer lifting value of the second plurality of integer lifting values is associated with an entry in the lifted matrix, and
each integer lifting value of the second plurality of integer lifting values is determined based on an operation involving the selected lifting size value and an integer lifting value of the first plurality of integer lifting values;

code for encoding a set of information bits based on the lifted matrix to produce a code word; and code for transmitting the code word.

17. The non-transitory computer-readable medium of claim 16, wherein:

the operation comprises a modulo operation, and the selected lifting size value is a divisor in the operation and the integer lifting value of the first plurality of integer lifting values is a dividend in the operation.

18. The non-transitory computer-readable medium of claim 16, wherein the plurality of lifting size values corresponds to a range of blocklengths associated with the base matrix.

19. The non-transitory computer-readable medium of claim 18, wherein the lifting size value is selected to achieve a target blocklength of the range of blocklengths.

20. The non-transitory computer-readable medium of claim 16, wherein:

the first plurality of integer lifting values are associated with a closed loop in the base matrix, and the first plurality of integer lifting values have a non-zero modulo sum for the closed loop.

* * * * *